(12) United States Patent
Liu et al.

(10) Patent No.: US 12,063,639 B2
(45) Date of Patent: Aug. 13, 2024

(54) CROSS-SUBBAND POWER RESERVATION SIGNAL

(71) Applicant: QUALCOMM Incorporated, San Diego, CA (US)

(72) Inventors: Chih-Hao Liu, San Diego, CA (US); Jing Sun, San Diego, CA (US); Yisheng Xue, San Diego, CA (US); Xiaoxia Zhang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 167 days.

(21) Appl. No.: 17/374,814

(22) Filed: Jul. 13, 2021

(65) Prior Publication Data

US 2023/0020766 A1    Jan. 19, 2023

(51) Int. Cl.
*H04W 72/044* (2023.01)
*H04W 72/0446* (2023.01)
*H04W 72/20* (2023.01)

(52) U.S. Cl.
CPC ... *H04W 72/0473* (2013.01); *H04W 72/0446* (2013.01); *H04W 72/20* (2023.01)

(58) Field of Classification Search
CPC ......... H04W 72/0473; H04W 72/0446; H04W 72/20; H04W 74/002; H04W 74/0808; H04W 52/04; H03G 3/3042
See application file for complete search history.

(56) References Cited

U.S. PATENT DOCUMENTS

| | | | | |
|---|---|---|---|---|
| 2006/0239272 | A1* | 10/2006 | Heidari-Bateni ... | H04W 72/566 370/395.21 |
| 2010/0091716 | A1* | 4/2010 | Bonta ..................... | H04W 4/20 370/329 |
| 2018/0049219 | A1* | 2/2018 | Gupta ............... | H04W 72/0453 |
| 2018/0091342 | A1 | 3/2018 | Ji et al. | |
| 2018/0131485 | A1* | 5/2018 | Wang ................ | H04W 72/0453 |
| 2018/0176961 | A1* | 6/2018 | Babaei ............. | H04W 74/0833 |
| 2020/0029318 | A1* | 1/2020 | Guo ...................... | H04W 72/23 |
| 2021/0144750 | A1* | 5/2021 | Cao ....................... | H04W 72/23 |
| 2021/0337512 | A1* | 10/2021 | Belleschi .............. | H04W 28/26 |
| 2022/0109546 | A1* | 4/2022 | Panteleev .............. | H04W 4/46 |
| 2022/0346105 | A1* | 10/2022 | Kalhan ................... | H04W 4/40 |
| 2022/0369417 | A1* | 11/2022 | Park ................. | H04W 28/0268 |
| 2022/0376816 | A1* | 11/2022 | Yoshioka .............. | H04W 72/20 |

* cited by examiner

*Primary Examiner* — Chirag G Shah
*Assistant Examiner* — Joshua Smith
(74) *Attorney, Agent, or Firm* — Holland & Hart LLP

(57) ABSTRACT

Methods, systems, and devices for wireless communications are described. A first user equipment (UE) may receive, from a second UE, a control message that indicates a duration of time the second UE has reserved at least a first subchannel of a first subband of a set of shared spectrum subbands. The duration of time may include a quantity of time periods. The first UE may transmit, during a time period of the quantity of time periods and in a second subchannel of the first subband, a power reservation signal that indicates a transmission power associated with the first UE beginning transmission to a third UE in a second subband of the set of shared spectrum subbands and partway through the time period. The first UE may transmit signaling to the third UE in the second subband partway through the time period and after transmitting the power reservation signal.

24 Claims, 10 Drawing Sheets

CROSS-SUBBAND POWER RESERVATION SIGNAL

FIELD OF TECHNOLOGY

The following relates to wireless communications, including cross-subband power reservation signals.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include one or more base stations or one or more network access nodes, each simultaneously supporting communication for multiple communication devices, which may be otherwise known as user equipment (UE).

In some examples, a UE may determine a receive power for communications. Improved techniques for determining a receive power may be desired.

SUMMARY

The described techniques relate to improved methods, systems, devices, and apparatuses that support cross-subband power reservation signaling. A user equipment (UE) may determine that it is going to begin transmitting partway through a time period (e.g., a slot) in a first shared-spectrum subband. However, another device may have already reserved the slot for a transmission to a recipient device in a second shared-spectrum subband. To ensure that the recipient device is able to account for the transmission by the UE (e.g., when determining a receive power for the slot), the UE may transmit a power reservation signal in the second shared-spectrum subband during a training symbol for an automatic gain control procedure at the recipient device.

A method for wireless communication at a first UE is described. The method may include receiving, from a second UE, a control message that indicates a duration of time the second UE has reserved at least a first subchannel of a first subband of a set of shared spectrum subbands, the duration of time including a quantity of time periods, transmitting, during a time period of the quantity of time periods and in a second subchannel of the first subband, a power reservation signal that indicates a transmission power associated with the first UE beginning transmission to a third UE in a second subband of the set of shared spectrum subbands and partway through the time period, and transmitting signaling to the third UE in the second subband partway through the time period and after transmitting the power reservation signal.

An apparatus for wireless communication at a first UE is described. The apparatus may include a processor, memory coupled with the processor, and instructions stored in the memory. The instructions may be executable by the processor to cause the apparatus to receive, from a second UE, a control message that indicates a duration of time the second UE has reserved at least a first subchannel of a first subband of a set of shared spectrum subbands, the duration of time including a quantity of time periods, transmit, during a time period of the quantity of time periods and in a second subchannel of the first subband, a power reservation signal that indicates a transmission power associated with the first UE beginning transmission to a third UE in a second subband of the set of shared spectrum subbands and partway through the time period, and transmit signaling to the third UE in the second subband partway through the time period and after transmitting the power reservation signal.

Another apparatus for wireless communication at a first UE is described. The apparatus may include means for receiving, from a second UE, a control message that indicates a duration of time the second UE has reserved at least a first subchannel of a first subband of a set of shared spectrum subbands, the duration of time including a quantity of time periods, means for transmitting, during a time period of the quantity of time periods and in a second subchannel of the first subband, a power reservation signal that indicates a transmission power associated with the first UE beginning transmission to a third UE in a second subband of the set of shared spectrum subbands and partway through the time period, and means for transmitting signaling to the third UE in the second subband partway through the time period and after transmitting the power reservation signal.

A non-transitory computer-readable medium storing code for wireless communication at a first UE is described. The code may include instructions executable by a processor to receive, from a second UE, a control message that indicates a duration of time the second UE has reserved at least a first subchannel of a first subband of a set of shared spectrum subbands, the duration of time including a quantity of time periods, transmit, during a time period of the quantity of time periods and in a second subchannel of the first subband, a power reservation signal that indicates a transmission power associated with the first UE beginning transmission to a third UE in a second subband of the set of shared spectrum subbands and partway through the time period, and transmit signaling to the third UE in the second subband partway through the time period and after transmitting the power reservation signal.

In some examples of the method, apparatuses, and non-transitory computer-readable medium described herein, transmitting the power reservation signal may include operations, features, means, or instructions for transmitting the power reservation signal during a temporally first symbol of the slot.

Some examples of the method, apparatuses, and non-transitory computer-readable medium described herein may further include operations, features, means, or instructions for receiving a second control message indicating that the second subchannel and the temporally first symbol may be reserved for the power reservation signal, where the power reservation signal may be transmitted during the temporally first symbol in the second subchannel based on the second control message.

In some examples of the method, apparatuses, and non-transitory computer-readable medium described herein, transmitting the power reservation signal may include operations, features, means, or instructions for transmitting the power reservation signal with the comb index, the cyclic shift, or both, based on the second control message.

In some examples of the method, apparatuses, and non-transitory computer-readable medium described herein, transmitting the power reservation signal may include operations, features, means, or instructions for transmitting the power reservation signal with a peak-to-average power ratio lower than a threshold, transmitting the power reservation signal as a comb-based reference signal, or both.

Some examples of the method, apparatuses, and non-transitory computer-readable medium described herein may further include operations, features, means, or instructions for performing a channel access procedure before the time period, where the power reservation signal may be transmitted based on performing the channel access procedure.

In some examples of the method, apparatuses, and non-transitory computer-readable medium described herein, the control message indicates a set of UEs permitted to transmit during the quantity of time periods and the method, apparatuses, and non-transitory computer-readable medium may include further operations, features, means, or instructions for determining that the set of UEs excludes the first UE, where the channel access procedure may be performed based on the determination.

Some examples of the method, apparatuses, and non-transitory computer-readable medium described herein may further include operations, features, means, or instructions for reserving a third subchannel of the second subband for at least a second time period and transmitting, during the second time period in a fourth subchannel of the second subband, an automatic gain control training signal that indicates a transmission power associated with the first UE beginning transmission in the fourth subchannel of the second subband partway through the second time period.

Some examples of the method, apparatuses, and non-transitory computer-readable medium described herein may further include operations, features, means, or instructions for reserving a third subchannel of the second subband for at least a second time period and transmitting, during the second time period in a fourth subchannel of the second subband, a second power reservation symbol that indicates a transmission power associated with the first UE beginning transmission in the fourth subchannel of the second subband partway through the second time period.

Some examples of the method, apparatuses, and non-transitory computer-readable medium described herein may further include operations, features, means, or instructions for determining that the quantity of time periods includes the time period in which the UE begins transmission partway through the time period, where the power reservation signal may be transmitted based on the determination.

Some examples of the method, apparatuses, and non-transitory computer-readable medium described herein may further include operations, features, means, or instructions for performing a channel access procedure within the time period and after transmitting the power reservation signal, where the signaling may be transmitted based on performing the channel access procedure.

A method for wireless communication at a first UE is described. The method may include receiving, from a second UE, a control message that indicates a duration of time the second UE has reserved at least a first subchannel of a subband of a set of shared spectrum bands, the duration of time including a quantity of time periods, receiving, from a third UE in a second subchannel of the subband during a time period of the quantity of time periods, a power reservation signal that indicates a transmission power associated with the first UE beginning transmission in a second subband of the set of shared spectrum subbands partway through the time period, and receiving, from the second UE during the time period, signaling in the first subchannel based on the power reservation signal.

An apparatus for wireless communication at a first UE is described. The apparatus may include a processor, memory coupled with the processor, and instructions stored in the memory. The instructions may be executable by the processor to cause the apparatus to receive, from a second UE, a control message that indicates a duration of time the second UE has reserved at least a first subchannel of a subband of a set of shared spectrum bands, the duration of time including a quantity of time periods, receive, from a third UE in a second subchannel of the subband during a time period of the quantity of time periods, a power reservation signal that indicates a transmission power associated with the first UE beginning transmission in a second subband of the set of shared spectrum subbands partway through the time period, and receive, from the second UE during the time period, signaling in the first subchannel based on the power reservation signal.

Another apparatus for wireless communication at a first UE is described. The apparatus may include means for receiving, from a second UE, a control message that indicates a duration of time the second UE has reserved at least a first subchannel of a subband of a set of shared spectrum bands, the duration of time including a quantity of time periods, means for receiving, from a third UE in a second subchannel of the subband during a time period of the quantity of time periods, a power reservation signal that indicates a transmission power associated with the first UE beginning transmission in a second subband of the set of shared spectrum subbands partway through the time period, and means for receiving, from the second UE during the time period, signaling in the first subchannel based on the power reservation signal.

A non-transitory computer-readable medium storing code for wireless communication at a first UE is described. The code may include instructions executable by a processor to receive, from a second UE, a control message that indicates a duration of time the second UE has reserved at least a first subchannel of a subband of a set of shared spectrum bands, the duration of time including a quantity of time periods, receive, from a third UE in a second subchannel of the subband during a time period of the quantity of time periods, a power reservation signal that indicates a transmission power associated with the first UE beginning transmission in a second subband of the set of shared spectrum subbands partway through the time period, and receive, from the second UE during the time period, signaling in the first subchannel based on the power reservation signal.

In some examples of the method, apparatuses, and non-transitory computer-readable medium described herein, receiving the signaling may include operations, features, means, or instructions for determining a receive power for receiving the signaling based on the power reservation signal.

Some examples of the method, apparatuses, and non-transitory computer-readable medium described herein may further include operations, features, means, or instructions for performing an automatic gain control procedure based on the power reservation signal, where the receive power may be determined based on performing the automatic gain control procedure.

In some examples of the method, apparatuses, and non-transitory computer-readable medium described herein, receiving the power reservation signal may include operations, features, means, or instructions for receiving the power reservation signal during a temporally first symbol of the slot.

Some examples of the method, apparatuses, and non-transitory computer-readable medium described herein may further include operations, features, means, or instructions for receiving a second control message indicating that the second subchannel and the temporally first symbol may be reserved for the power reservation signal, where the power reservation signal may be received during the temporally first symbol in the second subchannel based on the second control message.

In some examples of the method, apparatuses, and non-transitory computer-readable medium described herein, receiving the power reservation signal may include operations, features, means, or instructions for receiving the power reservation signal with the comb index, the cyclic shift, or both, based on the second control message

DETAILED DESCRIPTION

In some wireless communications systems, such as those that use shared (e.g., unlicensed) spectrum, a user equipment (UE) that has information to transmit over a subband may secure at least a portion (e.g., a subchannel) of that subband. For example, the UE may perform a channel access procedure, such as a listen-before-talk (LBT) procedure, to sense the subchannel before reserving the subchannel for a duration of time, referred to as the channel occupancy time (COT). The COT may span multiple time periods (e.g., slots) and the UE may transmit a training signal (e.g., a reference signal) in the beginning symbol of each slot to enable automatic gain control (AGC) at a recipient UE, which may improve reception during the rest of the slot. For example, the recipient UE may use the training signal to determine the receive power for the rest of the slot. But in some cases, a neighboring UE may begin transmitting partway through the slot in another subband, which may cause interference and result in the receive power of the recipient UE being insufficient or otherwise unsuitable.

According to the techniques described herein, a neighboring UE that intends to begin transmitting partway through a slot in one subband may help another UE determine a suitable receive power for the slot in another subband by transmitting a power reservation signal at the beginning of the slot. The power reservation signal may be associated with (e.g., indicate) the transmit power of the neighboring UE so the automatic gain control procedure of the other UE can account for mid-slot transmission by the neighboring UE. Thus, the receive power calculated by the other UE may reflect the mid-slot transmission expected by the neighboring UE, which may improve reception at the other UE. A mid-slot transmission may refer to a transmission that begins after the first symbol of a slot and does not necessarily require the transmission beginning midway (e.g., halfway) through the slot.

Aspects of the disclosure are initially described in the context of wireless communications systems. Aspects of the disclosure are further illustrated by and described with reference to a process flow. Aspects of the disclosure are further illustrated by and described with reference to apparatus diagrams, system diagrams, and flowcharts that relate to cross-subband power reservation signaling.

Figure 1:
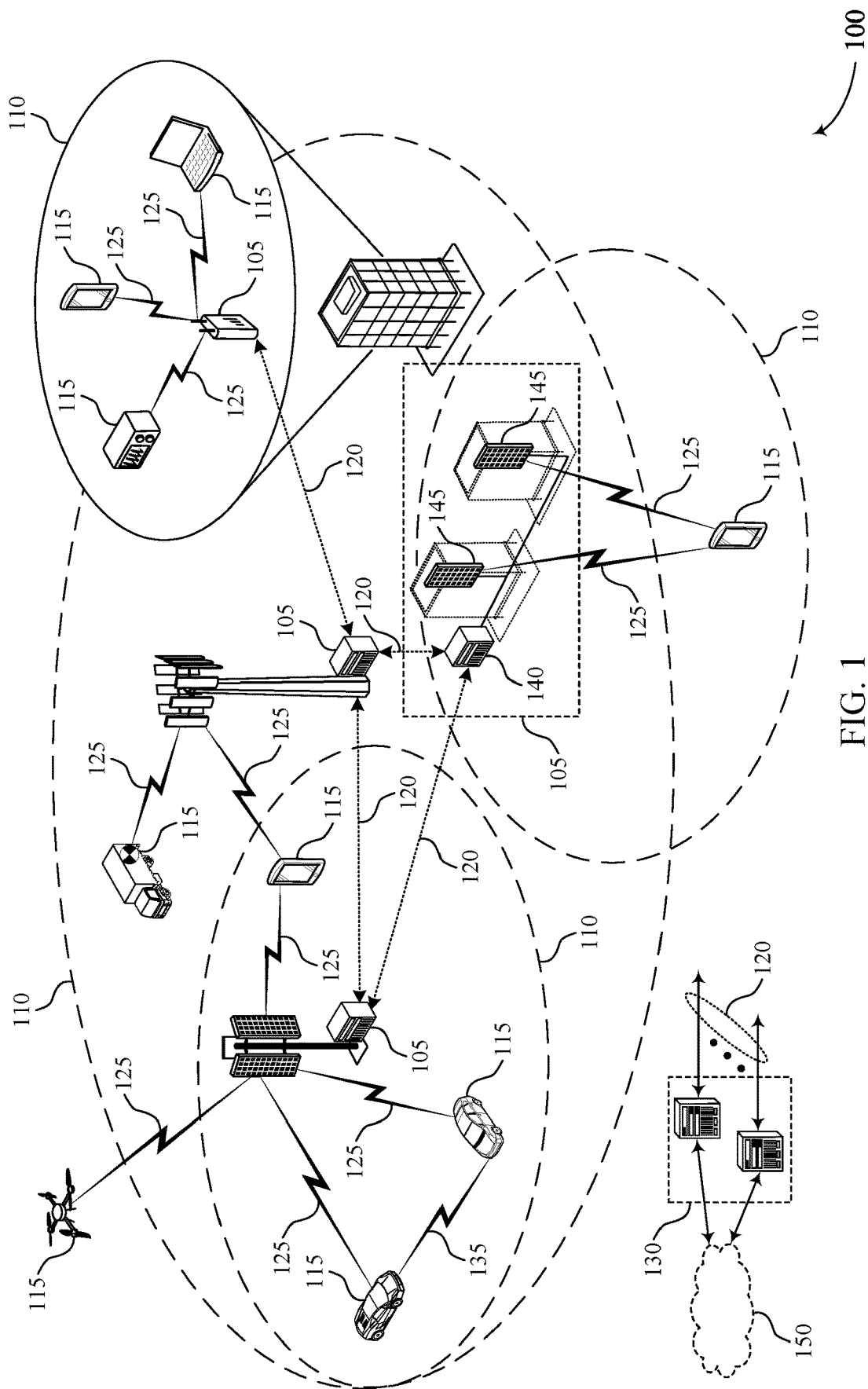
FIG. 1 illustrates an example of a wireless communications system that supports a cross-subband power reservation signal in accordance with aspects of the present disclosure.

FIG. 1 illustrates an example of a wireless communications system 100 that supports a cross-subband power reservation signal in accordance with aspects of the present disclosure. The wireless communications system 100 may include one or more base stations 105, one or more UEs 115, and a core network 130. In some examples, the wireless communications system 100 may be a Long Term Evolution (LTE) network, an LTE-Advanced (LTE-A) network, an LTE-A Pro network, or a New Radio (NR) network. In some examples, the wireless communications system 100 may support enhanced broadband communications, ultra-reliable (e.g., mission critical) communications, low latency communications, communications with low-cost and low-complexity devices, or any combination thereof.

The base stations 105 may be dispersed throughout a geographic area to form the wireless communications system 100 and may be devices in different forms or having different capabilities. The base stations 105 and the UEs 115 may wirelessly communicate via one or more communication links 125. Each base station 105 may provide a coverage area 110 over which the UEs 115 and the base station 105 may establish one or more communication links 125. The coverage area 110 may be an example of a geographic area over which a base station 105 and a UE 115 may support the communication of signals according to one or more radio access technologies.

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115, the base stations 105, or network equipment (e.g., core network nodes, relay devices, integrated access and backhaul (IAB) nodes, or other network equipment), as shown in FIG. 1.

The base stations 105 may communicate with the core network 130, or with one another, or both. For example, the base stations 105 may interface with the core network 130 through one or more backhaul links 120 (e.g., via an S1, N2, N3, or other interface). The base stations 105 may communicate with one another over the backhaul links 120 (e.g., via an X2, Xn, or other interface) either directly (e.g., directly between base stations 105), or indirectly (e.g., via core network 130), or both. In some examples, the backhaul links 120 may be or include one or more wireless links.

One or more of the base stations 105 described herein may include or may be referred to by a person having ordinary skill in the art as a base transceiver station, a radio base station, an access point, a radio transceiver, a NodeB, an eNodeB (eNB), a next-generation NodeB or a giga-NodeB (either of which may be referred to as a gNB), a Home NodeB, a Home eNodeB, or other suitable terminology.

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the base stations 105 and the network equipment including macro eNBs or gNBs, small cell eNBs or gNBs, or relay base stations, among other examples, as shown in FIG. 1.

The UEs 115 and the base stations 105 may wirelessly communicate with one another via one or more communication links 125 over one or more carriers. The term "carrier" may refer to a set of radio frequency spectrum resources having a defined physical layer structure for supporting the communication links 125. For example, a carrier used for a communication link 125 may include a portion of a radio frequency spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers.

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of determined bandwidths for carriers of a particular radio access technology (e.g., 1.4, 3, 5, 10, 15, 20, 40, or 80 megahertz (MHz)). Devices of the wireless communications system 100 (e.g., the base stations 105, the UEs 115, or both) may have hardware configurations that support communications over a particular carrier bandwidth or may be configurable to support communications over one of a set of carrier bandwidths. In some examples, the wireless communications system 100 may include base stations 105 or UEs 115 that support simultaneous communications via carriers associated with multiple carrier bandwidths. In some examples, each served UE 115 may be configured for operating over portions (e.g., a sub-band, a BWP) or all of a carrier bandwidth.

Signal waveforms transmitted over a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme, the coding rate of the modulation scheme, or both). Thus, the more resource elements that a UE 115 receives and the higher the order of the modulation scheme, the higher the data rate may be for the UE 115. A wireless communications resource may refer to a combination of a radio frequency spectrum resource, a time resource, and a spatial resource (e.g., spatial layers or beams), and the use of multiple spatial layers may further increase the data rate or data integrity for communications with a UE 115.

The time intervals for the base stations 105 or the UEs 115 may be expressed in multiples of a basic time unit which may, for example, refer to a sampling period of $T_s=1/(\Delta f_{max} \cdot N_f)$ seconds, where $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a number of slots. Alternatively, each frame may include a variable number of slots, and the number of slots may depend on subcarrier spacing. Each slot may include a number of symbol periods (e.g., depending on the length of the cyclic prefix prepended to each symbol period). In some wireless communications systems 100, a slot may further be divided into multiple mini-slots containing one or more symbols. Excluding the cyclic prefix, each symbol period may contain one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., the number of symbol periods in a TTI) may be variable. Additionally or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a number of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to a number of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

In some examples, a base station 105 may be movable and therefore provide communication coverage for a moving geographic coverage area 110. In some examples, different geographic coverage areas 110 associated with different technologies may overlap, but the different geographic coverage areas 110 may be supported by the same base station 105. In other examples, the overlapping geographic coverage areas 110 associated with different technologies may be supported by different base stations 105. The wireless communications system 100 may include, for example, a heterogeneous network in which different types of the base stations 105 provide coverage for various geographic coverage areas 110 using the same or different radio access technologies.

The wireless communications system 100 may be configured to support ultra-reliable communications or low-latency communications, or various combinations thereof. For example, the wireless communications system 100 may be configured to support ultra-reliable low-latency communications (URLLC) or mission critical communications. The UEs 115 may be designed to support ultra-reliable, low-latency, or critical functions (e.g., mission critical functions). Ultra-reliable communications may include private communication or group communication and may be supported by one or more mission critical services such as mission critical push-to-talk (MCPTT), mission critical video (MCVideo), or mission critical data (MCData). Support for mission critical functions may include prioritization of services, and mission critical services may be used for public safety or general commercial applications. The terms ultra-reliable, low-latency, mission critical, and ultra-reliable low-latency may be used interchangeably herein.

In some examples, a UE 115 may also be able to communicate directly with other UEs 115 over a device-to-device (D2D) communication link 135 (e.g., using a peer-to-peer (P2P) or D2D protocol). One or more UEs 115 utilizing D2D communications may be within the geographic coverage area 110 of a base station 105. Other UEs 115 in such a group may be outside the geographic coverage area 110 of a base station 105 or be otherwise unable to receive transmissions from a base station 105. In some examples, groups of the UEs 115 communicating via D2D communications may utilize a one-to-many (1:M) system in which each UE 115 transmits to every other UE 115 in the group. In some examples, a base station 105 facilitates the scheduling of resources for D2D communications. In other cases, D2D communications are carried out between the UEs 115 without the involvement of a base station 105.

In some systems, the D2D communication link 135 may be an example of a communication channel, such as a sidelink communication channel, between vehicles (e.g., UEs 115). In some examples, vehicles may communicate using vehicle-to-everything (V2X) communications, vehicle-to-vehicle (V2V) communications, or some combination of these. A vehicle may signal information related to traffic conditions, signal scheduling, weather, safety, emergencies, or any other information relevant to a V2X system. In some examples, vehicles in a V2X system may communicate with roadside infrastructure, such as roadside units, or with the network via one or more network nodes (e.g., base stations 105) using vehicle-to-network (V2N) communications, or with both.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the base stations 105 associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

Some of the network devices, such as a base station 105, may include subcomponents such as an access network entity 140, which may be an example of an access node controller (ANC). Each access network entity 140 may communicate with the UEs 115 through one or more other access network transmission entities 145, which may be referred to as radio heads, smart radio heads, or transmission/reception points (TRPs). Each access network transmission entity 145 may include one or more antenna panels. In some configurations, various functions of each access network entity 140 or base station 105 may be distributed across various network devices (e.g., radio heads and ANCs) or consolidated into a single network device (e.g., a base station 105).

The wireless communications system 100 may operate using one or more frequency bands, typically in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (HF) or very high frequency (VHF) portion of the spectrum below 300 MHz.

The wireless communications system 100 may utilize both licensed and unlicensed radio frequency spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. When operating in unlicensed radio frequency spectrum bands, devices such as the base stations 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples. An unlicensed radio frequency spectrum band may be an example of a shared spectrum band, which may be a spectrum band for which devices contend for access.

A base station 105 or a UE 115 may be equipped with multiple antennas, which may be used to employ techniques such as transmit diversity, receive diversity, multiple-input multiple-output (MIMO) communications, or beamforming. The antennas of a base station 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations. Additionally or alternatively, an antenna panel may support radio frequency beamforming for a signal transmitted via an antenna port.

Beamforming, which may also be referred to as spatial filtering, directional transmission, or directional reception, is a signal processing technique that may be used at a transmitting device or a receiving device (e.g., a base station 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In some examples (e.g., when accessing a shared spectrum, such as an unlicensed spectrum), a UE 115 may perform a channel access procedure (which may also be referred to as a channel sensing procedure or other suitable terminology). For example, before transmitting over a shared subband, a UE 115 may perform an LBT procedure that involves monitoring for energy in the subband. If a sufficiently low amount of energy is detected in the subband, the UE 115 may determine that the subband is free for transmission by the UE 115, which may be referred to as "clearing LBT." The UE 115 may then reserve the subband for a duration of time, referred to as the COT, which may span multiple slots. To enable automatic gain control at a recipient UE 115, the transmitting UE 115 may transmit a training signal at the beginning of at least one, if not every, slot in the COT. A training signal, which may also be referred to as a training symbol, an ACG signal or ACG training signal, may be a repetition of signaling in a symbol in the physical sidelink shared channel (PSSCH). For example, the training signal may be a repetition of the signaling in the first (e.g., leading, temporally first) symbol of the PSSCH.

A recipient UE 115 may use the training signal in a slot to determine the receive power for the remainder of the slot, which may improve reception. However, a neighboring UE 115 may start a transmission in a different subband partway (e.g., partially) through the slot. In such a scenario, the receive power determined by the recipient UE 115 may be too low or otherwise insufficient during the mid-slot transmission by the neighboring UE 115, which may negatively impact reception at the recipient UE 115.

According to the techniques described herein, a neighboring UE 115 may help improve reception at a recipient UE 115 by transmitting a power reservation signal at the beginning of a slot partway through which the neighboring UE 115 intends to start transmitting. The neighboring UE 115 may transmit the power reservation signal in the subband of the recipient UE 115 rather than the subband of the neighboring UE 115 (which the neighboring UE 115 may be unable to access until clearing LBT partway through the slot). The power reservation signal may reflect the transmit power of the neighboring UE 115 so that the recipient UE 115 can reserve some extra power for the slot than might otherwise be reserved.

Although described with reference to UEs 115, the techniques described herein are applicable to other wireless communication devices, such as base stations 105.

Figure 2:
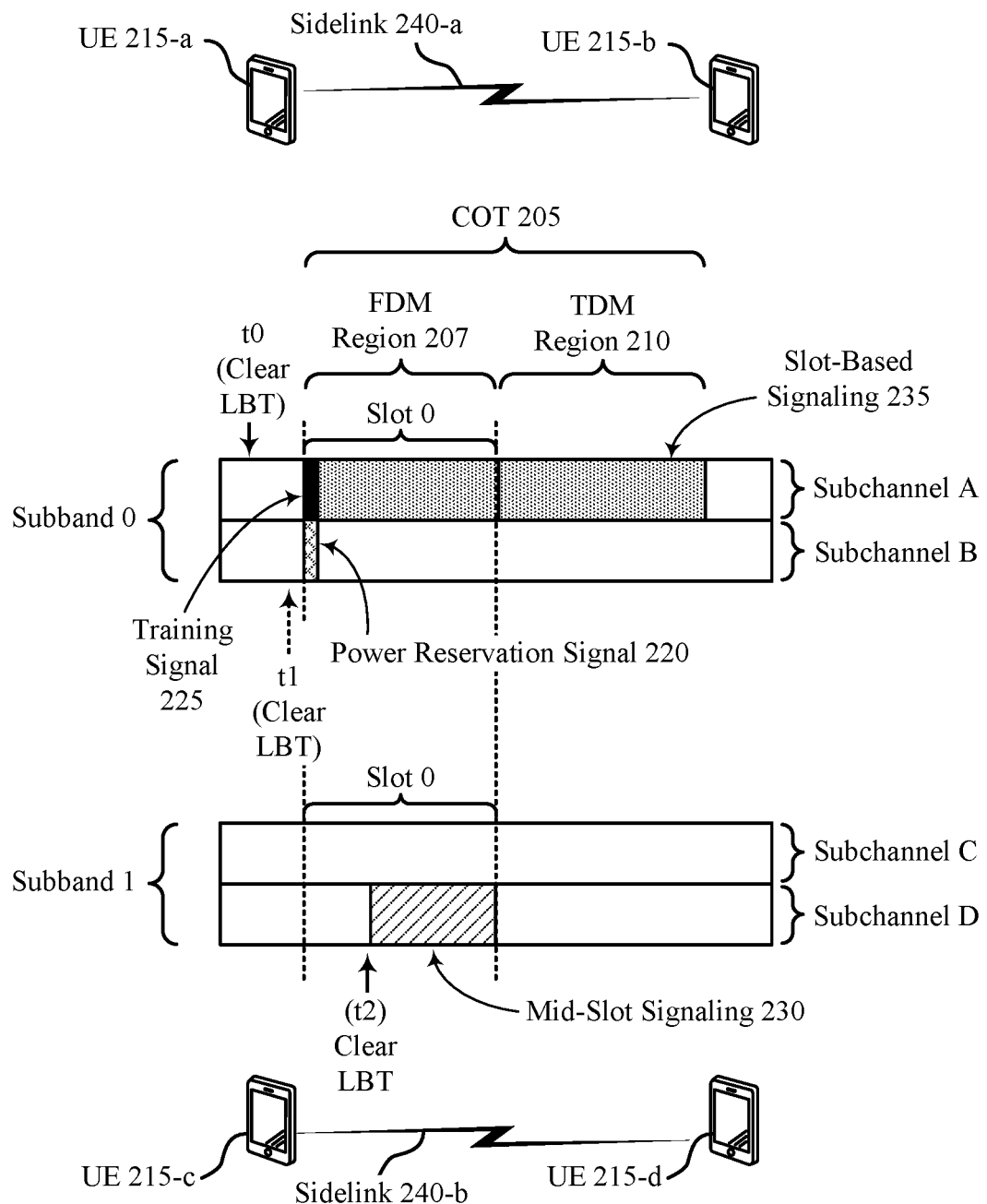
FIG. 2 illustrates an example of a wireless communications system that supports a cross-subband power reservation signal in accordance with aspects of the present disclosure.

FIG. 2 illustrates an example of a wireless communications system 200 that supports a cross-subband power reservation signal in accordance with aspects of the present disclosure. The wireless communications system 200 may include UE 215-*a*, UE 215-*b*, UE 215-*c*, and UE 215-*d*, which may be examples of UEs 115 as described with reference to FIG. 1. The UEs 215 may support sidelink communications, which may be communications that are sent directly between UEs without being routed through an intermediary device, such as a base station. Thus, UE 215-*a* may communicate with UE 215-*b* over the sidelink 240-*a* and UE 215-*c* may communicate with UE 215-*d* over the sidelink 240-*b*. In some examples, UE 215-*b* may be an example of a recipient UE as described herein and UE 215-*c* may be an example of a neighboring UE as described herein. UE 215-*c* may transmit a power reservation signal at the beginning of a slot in subband 0 and may transmit signaling partway through the slot in subband 1. A power reservation signal that is sent in a different subband than the signaling corresponding to the power reservation signal may be referred to as a cross-subband power reservation signal.

Each UE 215 may be configured to operate in one or more shared-spectrum subbands, where a subband refers to a set of contiguous frequencies. For example, the UEs 215 may be configured to operate in subband 0 and subband 1. Thus, the UEs 215 may be configured with transmit and receive circuitry that is capable of wirelessly communicating over subband 0 and subband 1. Each subband may include one or more subchannels, which may be smaller sets of contiguous frequencies relative to the subband. For example, subband 0 may include two subchannels: subchannel A and subchannel B. And subband 1 may include two subchannels: subchannel C and subchannel D. The subbands and subchannels described herein are for illustrative purposes and are not limiting in any way.

Before transmitting to UE 215-b over subband 0, UE 215-a may perform a channel access procedure (e.g., an LBT procedure) so that UE 215-a can reserve subband 0 (or a portion of subband 0, such as one or more subchannels) for a duration of time referred to as COT 205. For example, UE 215-a may clear LBT for subband 0 (or subchannel A) at time t0 and may reserve subband 0 (or subchannel A) after clearing LBT. In some examples, a COT-initiating UE may occupy a portion of the COT (e.g., if UE 215-a reserves a COT for subband 0, UE 215-a may occupy a subset of the subchannels).

After (or as part of) reserving subband 0, UE 215-a may broadcast a control message (e.g., COT structure information (COT-SI)) that indicates various aspects of the COT 205, which may encompass subband 0 or a portion of subband 0 (e.g., subchannel A). For example, the COT-SI may indicate the duration of the COT 205, the ending point of the COT 205, or both. Additionally or alternatively, the COT-SI may indicate whether other UEs are permitted to share (e.g., transmit in) the COT 205, a scenario that may be referred to as COT-sharing. If COT-sharing is permitted, the COT-SI may identify the UEs that are permitted to share the COT 205. Additionally or alternatively, the COT-SI may indicate various regions of the COT 205 that are for COT-sharing. For example, the COT-SI may indicate an FDM region 207 in which COT-sharing UEs are permitted to send signaling using FDM. Additionally or alternatively, the COT-SI may indicate a TDM region 210 in which COT-sharing UEs are permitted to send signaling using TDM. The COT-SI may be carried or included in a sidelink control information (SCI) message, such as SCI1 or SCI2.

The COT 205 may span (e.g., include) one or more time periods, such as slots. For example, the COT 205 may include slot 0, among other slots. To help improve reception at UE 215-b during slot 0, UE 215-a may transmit a training signal 225 (e.g., an AGC training signal) at the beginning of slot 0. For example, UE 215-a may transmit the training signal 225 in the first (e.g., leading, temporally first) symbol of slot 0. UE 215-b may use the training signal 225 in a procedure to determine one or more power characteristics for UE 215-b. For example, UE 215-b may use the training signal 225 in an AGC procedure to determine the receive power for slot 0.

To help UE 215-b calculate a suitable receive power for slot 0, UE 215-c may transmit the power reservation signal 220 at the same time, or nearly the same time, as the training signal 225. For example, UE 215-c may transmit the power reservation signal 220 during the first symbol of slot 0 in subchannel B of subband 0. UE 215-c may transmit the power reservation signal 220 in subband 0 because the UE 215-c may not be able to transmit in subband 1 until after UE 215-c clears LBT for subband 1 (or for subchannel D of subband 1) at time t2. UE 215-a may perform and clear LBT based on UE 215-a being excluded from sharing the COT 205, based on UE 215-a being scheduled to transmit in subband 1, or both. After clearing LBT at time t2, UE 215-a may transmit mid-slot signaling 230 (e.g., to hold subband 1 or subchannel D until UE 215-a can switch to slot-based signaling after slot 0).

The power reservation signal 220 may indicate the transmit power for the mid-slot signaling 230, and thus may allow UE 215-a to compensate for the mid-slot signaling 230 by UE 215-c in subband 1, which may interfere with the slot-based signaling 235 by UE 215-a (or other signaling by COT-sharing UEs) in subchannel A of subband 0. Slot-based signaling may refer to signaling that begins at the beginning of a slot and that lasts for the duration of the slot. In some examples, the power reservation signal 220 may explicitly indicate the transmit power via one or more bits. In other examples, the power reservation signal may implicitly indicate the transmit power by being transmitted using the transmit power. UE 215-c may transmit the power reservation signal 220 based on determining that the mid-slot signaling by UE 215-c will occur (or will likely occur) during a slot of the COT 205. UE 215-c may determine the COT 205 based on the COT-SI broadcast by UE 215-a.

In some examples, the resources for the power reservation signal 220 may be preconfigured at UE 215-c. For example, UE 215-c may receive a control message (e.g., from another UE or from a base station) that indicates resources reserved (e.g., allocated) for power reservation signaling. For example, the control message may indicate temporal resources (e.g., the first symbol of slot 0) and frequency resources (e.g., subchannel B) reserved for power reservation signaling. Additionally or alternatively, the control message may indicate one or more characteristics for the power reservation signal 220. For example, the control message may indicate a comb index for the power reservation signal (e.g., if the power reservation is a comb-based reference signal), a cyclic shift for the power reservation signal, a peak-to-average power ratio (PAPR) for the power reservation signal, or a combination thereof, among other characteristics. In some examples, the comb index, cyclic shift, or both may be based on the index of the subband for the mid-slot signaling 230 (e.g., subband 1). The control message may be a radio resource control (RRC) message, a downlink control information (DCI) message, or a medium-access control (MAC) control element (MAC-CE), among other options.

In some examples, UE 215-a may perform mid-slot signaling (e.g., mini-slot transmissions) after clearing the LBT and before the beginning of the COT 205, where a mini-slot transmission refers to a transmission that lasts for a fraction of a slot. For example, UE 215-a may perform a mini-slot transmission in subchannel A before slot 0, which may help UE 215-a hold subband 0 or subchannel A so that UE 215-a can switch to slot-based signaling. In such a scenario, UE 215-a may leave a gap between the end of the mini-slot transmission and a slot of COT 205, which may allow other UEs (such as UE 215-c) to perform a channel access procedure before transmitting a power reservation signal. For example, before transmitting the power reservation signal 220 in subchannel B, UE 215-c may clear LBT at time t1 for subchannel A, for subchannel B, or for both (e.g., for subband 0). In some examples, UE 215-c may perform a simplified or shortened channel access procedure, such as a one-shot LBT procedure. The gap left by UE 215-a may be a 16 μs gap, a 25 μs gap, or other duration. In some examples, the gap left by UE 215-a may be at the end of a slot in the FDM region, the non-sharing region, or the TDM region of the COT 205 or a previous COT. In some examples, UE 215-c may perform the channel access procedure based on the UE 215-c being omitted from a group of UEs permitted to share COT 205. In some examples, UE 215-*c* may perform the channel access procedure regardless of whether UE 215-*c* is permitted to share COT 205. Although shown occurring between the end of the mini-slot transmission and a slot of COT 205, the gap can additionally or alternatively occur at other locations. For instance, the gap may occur after switching to slot-based transmissions. In some examples, the gap may be at the end of the prior slot where UE 215-*a* clears LBT and starts a mini-slot transmission.

Thus, UE 215-*c* may transmit a power reservation signal in subband 0 to help UE 215-*b* compensate for mid-slot signaling by UE 215-*c* in subband 1. Although described with reference to UEs and sidelink communications, the techniques described herein may be implemented by any type of wireless device using any type of communications.

Figure 3:
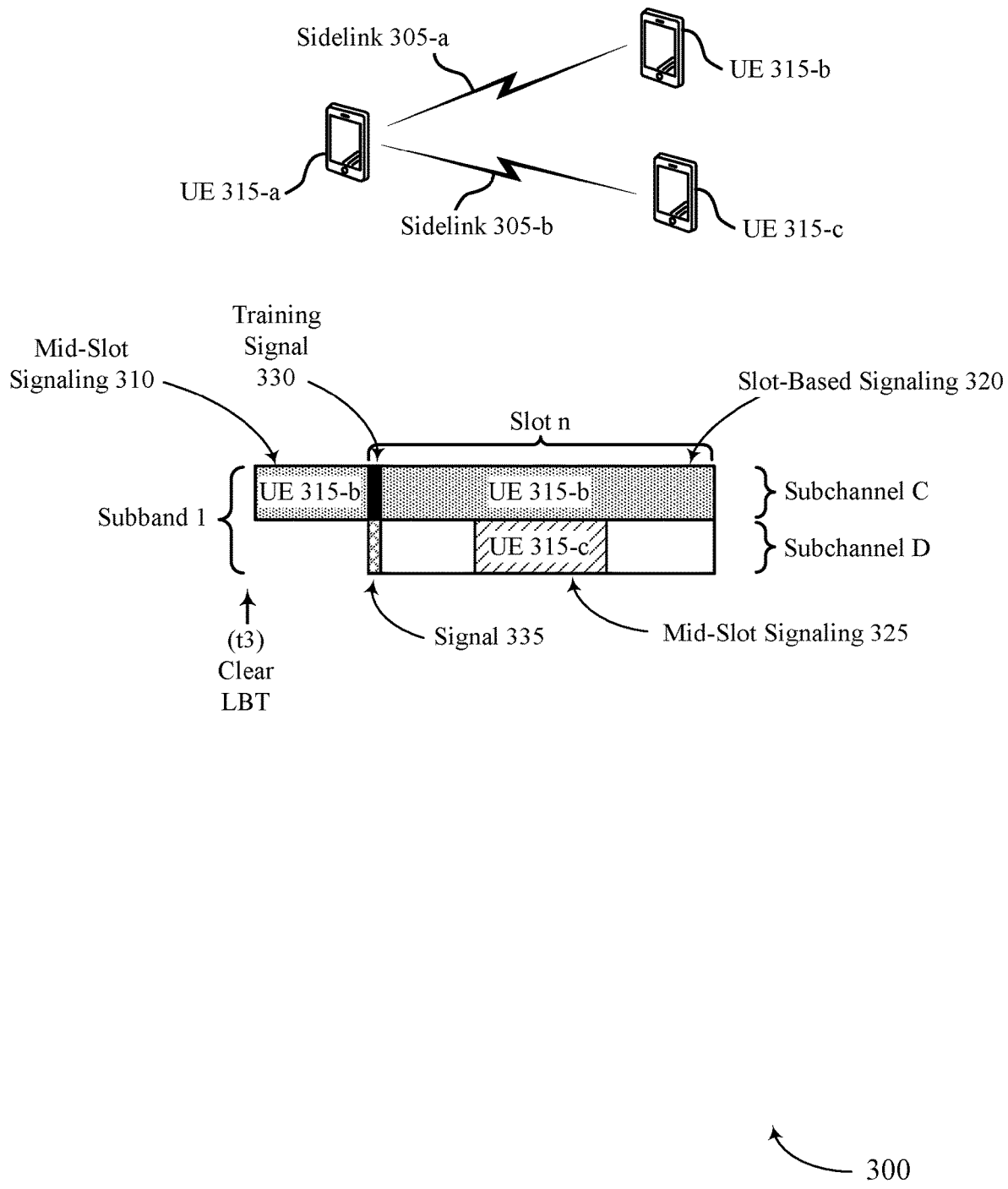
FIG. 3 illustrates an example of a wireless communications system that supports a cross-subband power reservation signal in accordance with aspects of the present disclosure.

FIG. 3 illustrates an example of a wireless communications system 300 that supports a cross-subband power reservation signal in accordance with aspects of the present disclosure. The wireless communications system 300 may include UE 315-*a*, UE 315-*b*, and UE 315-*c*, which may be examples of a UE 115 as described with reference to FIG. 1. The UEs 315 may support sidelink communications. Thus, UE 315-*a* may communicate with UE 315-*b* over the sidelink 305-*a* and UE 315-*a* may communicate with UE 315-*c* over the sidelink 305-*b*. For example, UE 315-*a* may use sidelink 305-*a* to transmit mid-slot signaling 310 and slot-based signaling 320 to UE 315-*b*; and UE 315-*a* may use sidelink 305-*b* to transmit mid-slot signaling 325 to UE 315-*c*. In some examples, UE 315-*a* may be an example of UE 215-*c* as described with reference to FIG. 2. Thus, aspects of FIG. 3 may occur after UE 315-*c* has performed the operations described with reference to FIG. 2.

At time t3, UE 315-*a* may clear LBT for subband 1. After clearing LBT at time t3, UE 315-*a* may reserve subchannel C for transmission to UE 315-*b* during a COT that includes slot n. In some examples, UE 315-*a* may perform a mid-slot transmission before the beginning of slot n (e.g., to hold subband 1 or subchannel C until the COT begins). In such a scenario, UE 315-*a* may be said to switch from mini-slot signaling to slot-based signaling.

To help improve reception at UE 315-*b* during slot n, UE 315-*a* may transmit a training signal 330 (e.g., an AGC training signal) at the beginning of slot n. For example, UE 315-*a* may transmit the training signal 330 in the first symbol of slot n. UE 315-*b* may use the training signal 330 in procedure to determine one or more power characteristics for UE 315-*b*. For example, UE 315-*b* may use the training signal 330 in an AGC procedure to determine the receive power for slot 0.

To further improve reception at UE 315-*b* during slot n, UE 315-*a* may transmit signal 335, which may be associated with the mid-slot signaling 325. For example, the signal 335 may be transmitted using (or may otherwise indicate) the transmit power used for the mid-slot signaling 325. Thus, the signal 335 may help UE 315-*b* select a receive power (e.g., for slot n) that compensates for the mid-slot signaling 325. The signal 335 may be a training signal such as an AGC training signal or a power reservation signal as described herein. If the signal 335 is a training signal, the signal 335 may be a repetition of the second symbol of slot n (e.g., the first symbol of the PSSCH). If the signal 335 is a training signal, the signal 335 may have increased (e.g., boosted) power the relative to the training signal 330, which may improve the AGC procedure at UE 315-*b*. If the signal 335 is a power reservation signal, the signal 335 may be a low PAPR signal (e.g., a signal with a PAPR below a threshold value) or a comb-based reference signal (e.g., with different mini-slots taking different comb indices, cyclic shifts, or both), among other options.

Although described with reference to UEs and sidelink communications, the techniques described herein may be implemented by any type of wireless device using any type of communications.

Figure 4:
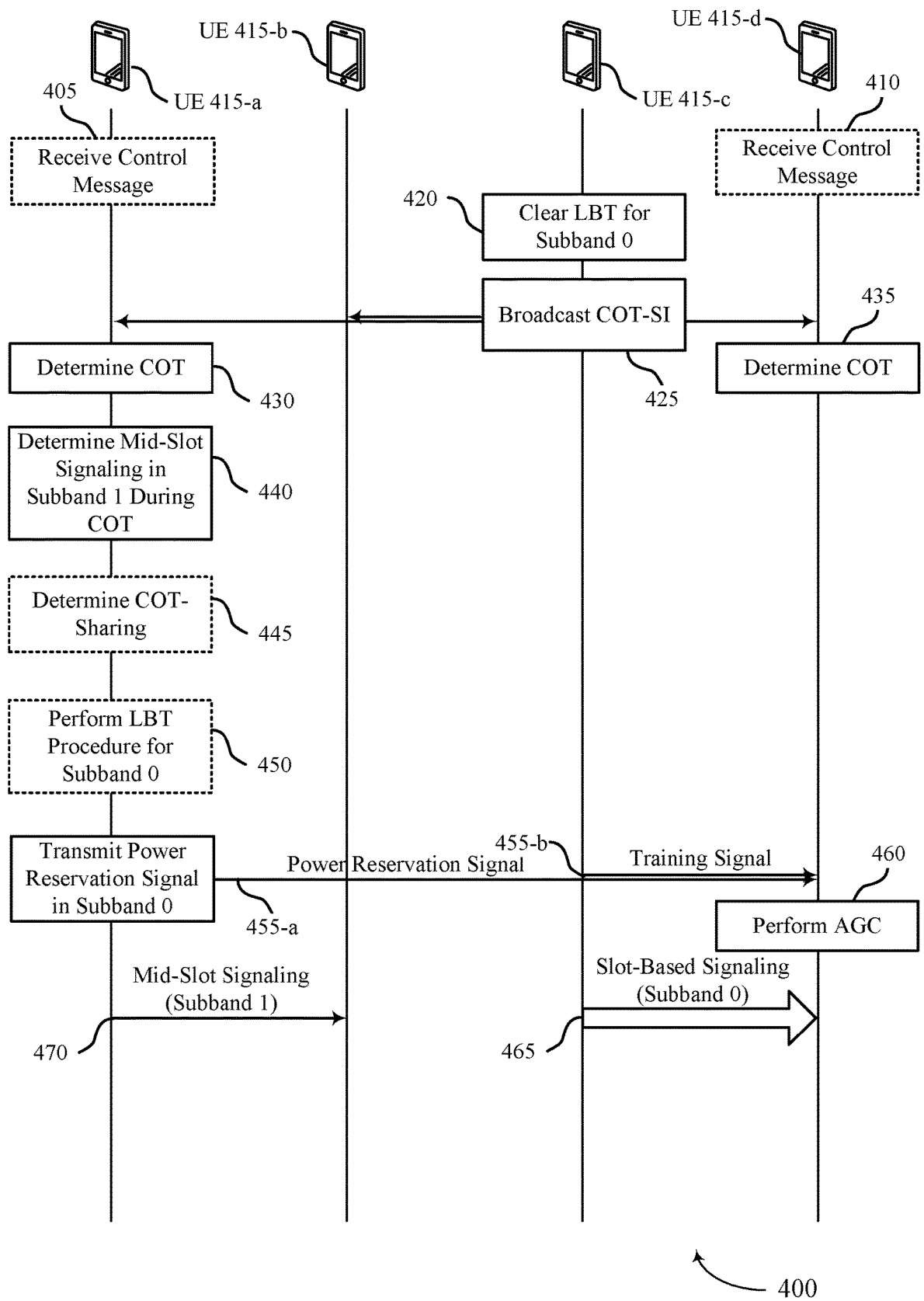
FIG. 4 illustrates an example of a process flow that supports a cross-subband power reservation signal in accordance with aspects of the present disclosure.

FIG. 4 illustrates an example of a process flow 400 that supports a cross-subband power reservation signal in accordance with aspects of the present disclosure. In some examples, the process flow 400 may be related to aspects of the wireless communications system 100, the wireless communications system 200, or the wireless communications system 300. For example, the process flow 400 may be implemented by UEs 415 (e.g., UE 415-*a* through 415-*d*), which may be examples of a UE as described herein. UE 415-*a* may be configured to operate over a set of shared-spectrum subbands that includes at least subband 0 and subband 1 and may monitor for COT-SI associated with those subbands.

At 405, UE 415-*a* may receive a control message that indicates resources for power reservation signaling, characteristics for a power reservation signal, or both. For example, the control message may indicate temporal resources and frequency resources reserved for power reservation signaling. Additionally or alternatively, the control message may indicate a comb index for the power reservation signal, a cyclic shift for the power reservation signal, a threshold PAPR for the power reservation signal, or a combination thereof, among other characteristics. At 410, UE 415-*d* may receive a control message similar to (or the same as) the control message received by UE 415-*a* at 405. The other UEs 415 may also receive control messages similar to (or the same as) the control message received by UE 415-*a* at 405 (e.g., so that the UEs 415 can communicate around the resources reserved for power reservation signaling). The control message(s) received at 405 and 410 may be received from a UE or a base station. In some examples, the control message(s) received at 405 and 410 may be RRC messages, DCI message, or MAC-CEs.

At 420, UE 415-*c* may clear LBT for a first subband (e.g., subband 0). For example, UE 415-*c* may perform an LBT procedure for subband 0 and may determine that subband 0 is free for UE 415-*c* to reserve. Accordingly, UE 415-*c* may reserve one or more (or all) subchannels of subband 0 for a duration of time (e.g., for a COT). At 425, UE 415-*c* may broadcast a control message (e.g., COT-SI) associated with the COT. The COT-SI may indicate various parameters associated with the COT, such as the duration of the COT, the expiration of the COT, whether COT-sharing is permitted, which UEs are permitted to COT-share (if applicable), or a combination thereof, among other parameters. In some examples, the COT-SI may be used to reserve the COT; in other examples, the COT-SI may be broadcast after UE 415-*c* has reserved the COT.

At 430, UE 415-*a* may determine the COT based on the COT-SI. For example, UE 415-*a* may determine that UE 415-*c* has reserved at least a first subchannel (e.g., subchannel A) of subband 0 for a duration of time. At 435, UE 415-*d* may determine the COT based on the COT-SI.

At 440, UE 415-*a* may determine that UE 415-*a* intends to transmit mid-slot signaling in a second subband (e.g., subband 1) during a slot (e.g., slot x) of the COT for subband 0. Additionally or alternatively, UE 415-*a* may a determine that UE 415-*a* intends to switch from mini-slot signaling to slot-based signaling between the slot and the next (e.g., adjacent) slot.

At 445, UE 415-*a* may determine whether UE 415-*a* is permitted to share the COT with UE 415-*c*. UE 415-*a* may determine whether UE 415-*a* is permitted to share the COT based on the COT-SI, which may indicate the identities of UEs permitted to share the COT. At 450, UE 415-*a* may perform a channel access procedure, such as an LBT procedure, for subband 0 or a portion of subband 0. UE 415-*a* may perform the LBT procedure based on determining that UE 415-*a* intends to transmit mid-slot signaling in subband 1 during slot x of the COT for subband 0. In some examples, the LBT procedure may be a simplified or shortened LBT procedure, such as a one-shot LBT procedure. In some examples, UE 415-*a* may perform the LBT procedure during a gap between a mini-slot transmission by UE 415-*c* over subchannel A and slot x (e.g., a slot-based transmission by UE 415-*c* over subchannel A). In some examples, UE 415-*a* may perform the LBT procedure for subband 0 based on whether UE 415-*a* is permitted to share the COT. For example, UE 415-*a* may perform the LBT procedure for subband 0 if UE 415-*a* is not permitted to share the COT.

At 455-*b*, UE 415-*c* may transmit a training signal (e.g., an AGC training signal) to UE 415-*d*. For example, UE 415-*c* may transmit the training signal during the first symbol of slot x in subchannel A of subband 0.

At 455-*a*, UE 415-*a* may transmit a power reservation signal to UE 415-*d*. The power reservation signal may be transmitted using resources indicated by the control message received at 405. In some examples, the power reservation signal may be transmitted during the first symbol of slot x in a second subchannel (e.g., subchannel B) of subband 0. Thus, the power reservation signal may coincide (e.g., at least partially overlap in time) with the training signal transmitted by UE 415-*c*. The power reservation signal may be transmitted according to one or more characteristics indicated by the control signal received at 405. UE 415-*d* may transmit the power reservation signal based on determining that UE 415-*d* intends to transmit mid-slot signaling in subband 1 during slot x of the COT for subband 0, based on determining that UE 415-*d* intends to switch from mid-slot signaling to slot-based signaling after slot x, or both. In some examples, UE 415-*d* may monitor for the power reservation signal using the resources indicated by the control message received at 410.

At 460, UE 415-*d* may perform a procedure to determine one or more power characteristics. For example, UE 415-*d* may perform an AGC procedure to determine a receive power for slot x of the COT for subband 0. The UE 415-*d* may perform the AGC procedure based on (e.g., using) the training signal received at 455-*b*, the power reservation signal received at 455-*a*, or both.

At 465, UE 415-*c* may transmit slot-based signaling to UE 415-*d*. For example, UE 415-*c* may transmit signaling to UE 415-*d* during slot x in subchannel A of subband 0. UE 415-*d* may receive the signaling from UE 415-*c* using the receive power determined at 460. Thus, UE 415-*d* may be said to receive the signaling from UE 415-*c* based on the power reservation signal, which was used in the AGC procedure to determine the receive power. At 470, UE 415-*a* may transmit mid-slot signaling to UE 415-*b*. For example, UE 415-*a* may begin transmitting signaling to UE 415-*b* partway through slot x in subband 1. The receive power used by UE 415-*d* may compensate for the mid-slot signaling by UE 415-*a*, and thus UE 415-*d* may reliably receive the signaling from UE 415-*c* despite any interference caused by the mid-slot signaling from UE 415-*a*.

Alternative examples of the foregoing may be implemented, where some operations are performed in a different order than described, are performed in parallel, or are not performed at all. In some cases, operations may include additional features not mentioned herein, or further operations may be added. Additionally, certain operations may be performed multiple times or certain combinations of operations may repeat or cycle.

Figure 5:
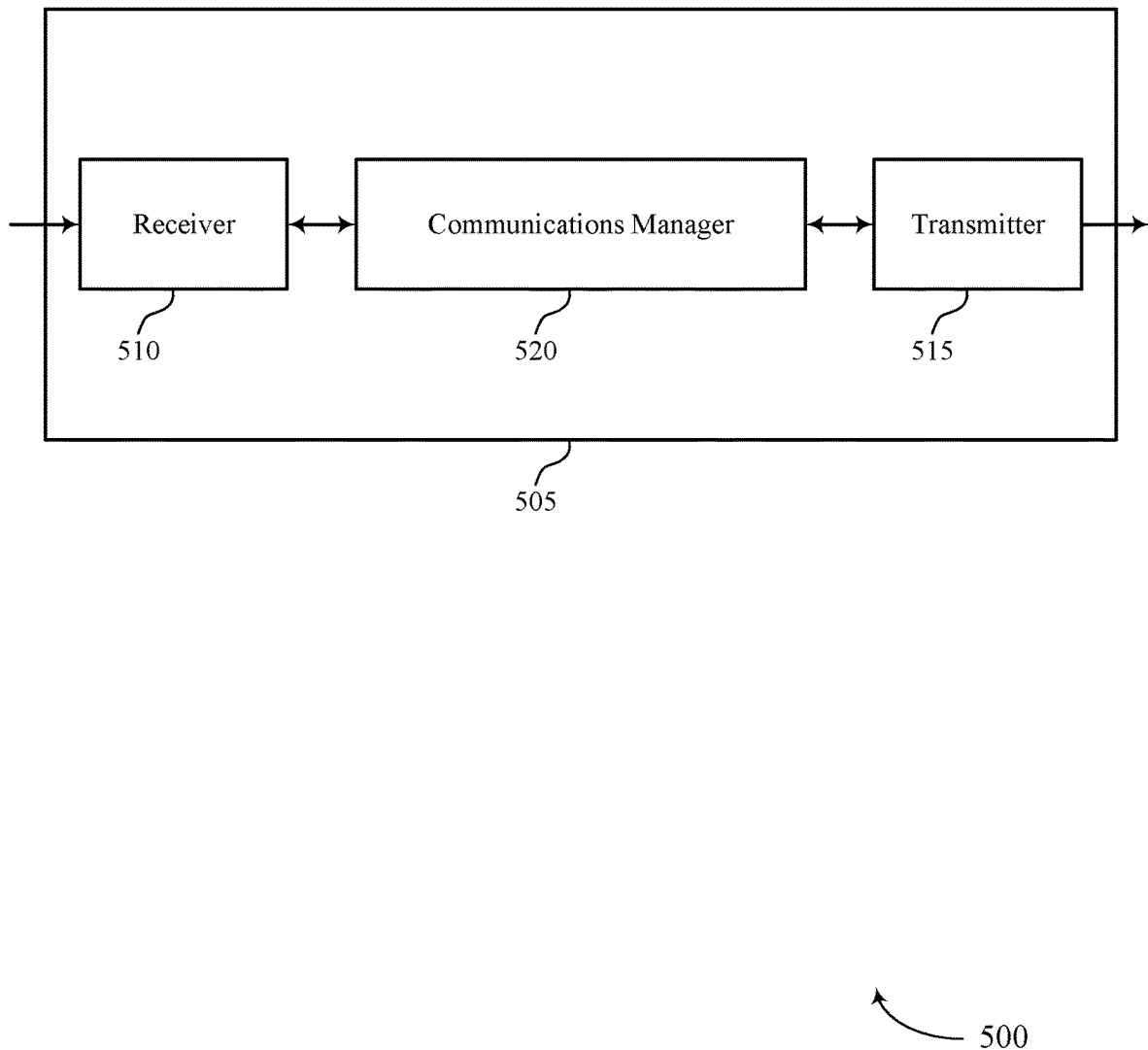
FIGS. 5 and 6 show block diagrams of devices that support a cross-subband power reservation signal in accordance with aspects of the present disclosure.

FIG. 5 shows a block diagram 500 of a device 505 that supports a cross-subband power reservation signal in accordance with aspects of the present disclosure. The device 505 may be an example of aspects of a UE 115 as described herein. The device 505 may include a receiver 510, a transmitter 515, and a communications manager 520. The device 505 may also include a processor. Each of these components may be in communication with one another (e.g., via one or more buses).

The receiver 510 may provide a means for receiving information such as packets, user data, control information, or any combination thereof associated with various information channels (e.g., control channels, data channels, information channels related to cross-subband power reservation signal). Information may be passed on to other components of the device 505. The receiver 510 may utilize a single antenna or a set of multiple antennas.

The transmitter 515 may provide a means for transmitting signals generated by other components of the device 505. For example, the transmitter 515 may transmit information such as packets, user data, control information, or any combination thereof associated with various information channels (e.g., control channels, data channels, information channels related to cross-subband power reservation signal). In some examples, the transmitter 515 may be co-located with a receiver 510 in a transceiver module. The transmitter 515 may utilize a single antenna or a set of multiple antennas.

The communications manager 520, the receiver 510, the transmitter 515, or various combinations thereof or various components thereof may be examples of means for performing various aspects of cross-subband power reservation signal as described herein. For example, the communications manager 520, the receiver 510, the transmitter 515, or various combinations or components thereof may support a method for performing one or more of the functions described herein.

In some examples, the communications manager 520, the receiver 510, the transmitter 515, or various combinations or components thereof may be implemented in hardware (e.g., in communications management circuitry). The hardware may include a processor, a digital signal processor (DSP), an application-specific integrated circuit (ASIC), a field-programmable gate array (FPGA) or other programmable logic device, a discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally or alternatively, in some examples, the communications manager 520, the receiver 510, the transmitter 515, or various combinations or components thereof may be implemented in code (e.g., as communications management software or firmware) executed by a processor. If implemented in code executed by a processor, the functions of the communications manager 520, the receiver 510, the transmitter 515, or various combinations or components thereof may be performed by a general-purpose processor, a DSP, a central processing unit (CPU), an ASIC, an FPGA, or any combination of these or other programmable logic devices (e.g., configured as or otherwise supporting a means for performing the functions described in the present disclosure).

In some examples, the communications manager 520 may be configured to perform various operations (e.g., receiving, monitoring, transmitting) using or otherwise in cooperation with the receiver 510, the transmitter 515, or both. For example, the communications manager 520 may receive information from the receiver 510, send information to the transmitter 515, or be integrated in combination with the receiver 510, the transmitter 515, or both to receive information, transmit information, or perform various other operations as described herein.

The communications manager 520 may support wireless communication at a first UE in accordance with examples as disclosed herein. For example, the communications manager 520 may be configured as or otherwise support a means for receiving, from a second UE, a control message that indicates a duration of time the second UE has reserved at least a first subchannel of a first subband of a set of shared spectrum subbands, the duration of time including a quantity of time periods. The communications manager 520 may be configured as or otherwise support a means for transmitting, during a time period of the quantity of time periods and in a second subchannel of the first subband, a power reservation signal that indicates a transmission power associated with the first UE beginning transmission to a third UE in a second subband of the set of shared spectrum subbands and partway through the time period. The communications manager 520 may be configured as or otherwise support a means for transmitting signaling to the third UE in the second subband partway through the time period and after transmitting the power reservation signal.

Additionally or alternatively, the communications manager 520 may support wireless communication at a first UE in accordance with examples as disclosed herein. For example, the communications manager 520 may be configured as or otherwise support a means for receiving, from a second UE, a control message that indicates a duration of time the second UE has reserved at least a first subchannel of a subband of a set of shared spectrum bands, the duration of time including a quantity of time periods. The communications manager 520 may be configured as or otherwise support a means for receiving, from a third UE in a second subchannel of the subband during a time period of the quantity of time periods, a power reservation signal that indicates a transmission power associated with the first UE beginning transmission in a second subband of the set of shared spectrum subbands partway through the time period. The communications manager 520 may be configured as or otherwise support a means for receiving, from the second UE during the time period, signaling in the first subchannel based on the power reservation signal.

By including or configuring the communications manager 520 in accordance with examples as described herein, the device 505 (e.g., a processor controlling or otherwise coupled to the receiver 510, the transmitter 515, the communications manager 520, or a combination thereof) may support techniques for improved communication reliability.

Figure 6:
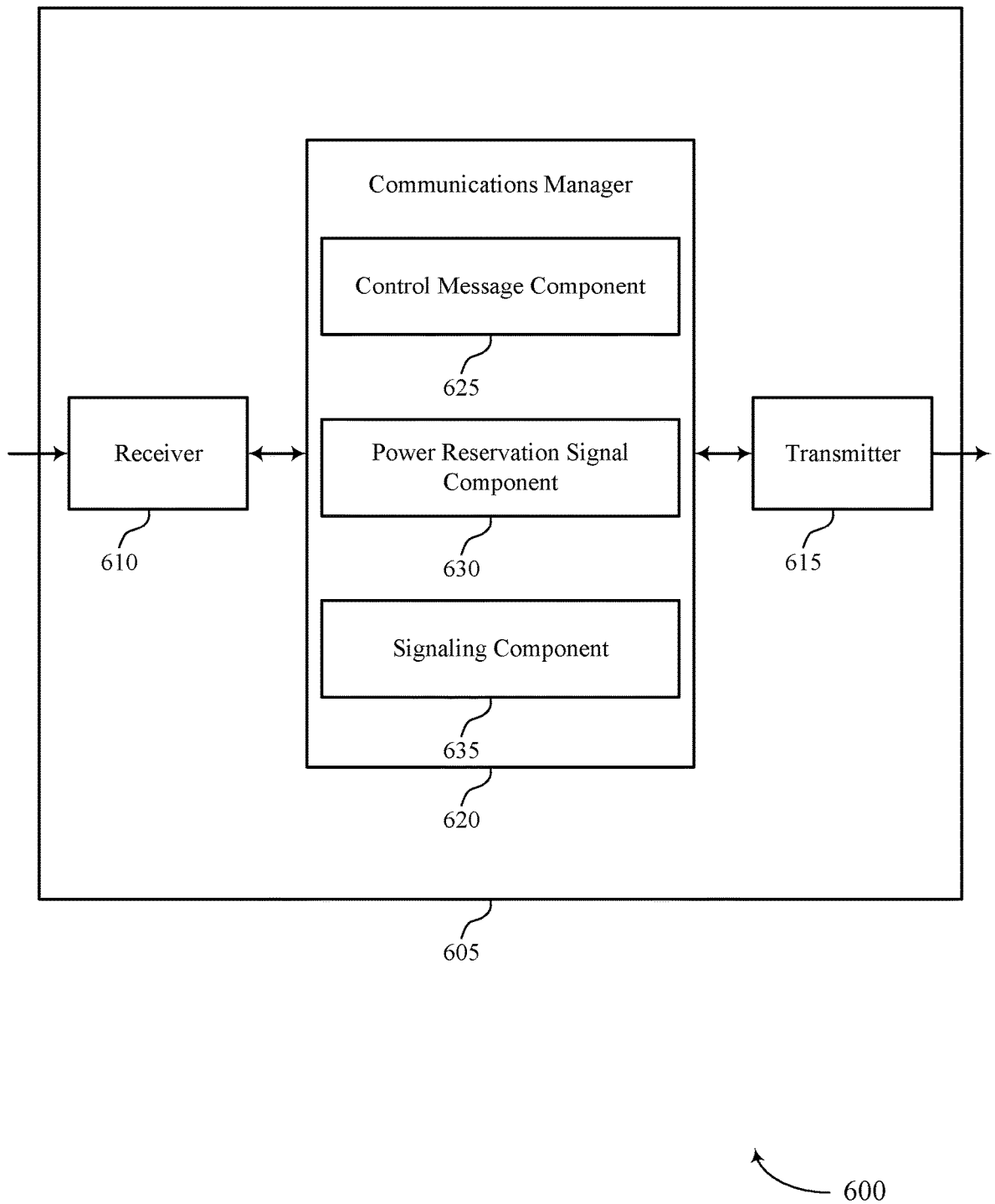

FIG. 6 shows a block diagram 600 of a device 605 that supports a cross-subband power reservation signal in accordance with aspects of the present disclosure. The device 605 may be an example of aspects of a device 505 or a UE 115 as described herein. The device 605 may include a receiver 610, a transmitter 615, and a communications manager 620.

The device 605 may also include a processor. Each of these components may be in communication with one another (e.g., via one or more buses).

The receiver 610 may provide a means for receiving information such as packets, user data, control information, or any combination thereof associated with various information channels (e.g., control channels, data channels, information channels related to cross-subband power reservation signal). Information may be passed on to other components of the device 605. The receiver 610 may utilize a single antenna or a set of multiple antennas.

The transmitter 615 may provide a means for transmitting signals generated by other components of the device 605. For example, the transmitter 615 may transmit information such as packets, user data, control information, or any combination thereof associated with various information channels (e.g., control channels, data channels, information channels related to cross-subband power reservation signal). In some examples, the transmitter 615 may be co-located with a receiver 610 in a transceiver module. The transmitter 615 may utilize a single antenna or a set of multiple antennas.

The device 605, or various components thereof, may be an example of means for performing various aspects of cross-subband power reservation signal as described herein. For example, the communications manager 620 may include a control message component 625, a power reservation signal component 630, a signaling component 635, or any combination thereof. The communications manager 620 may be an example of aspects of a communications manager 520 as described herein. In some examples, the communications manager 620, or various components thereof, may be configured to perform various operations (e.g., receiving, monitoring, transmitting) using or otherwise in cooperation with the receiver 610, the transmitter 615, or both. For example, the communications manager 620 may receive information from the receiver 610, send information to the transmitter 615, or be integrated in combination with the receiver 610, the transmitter 615, or both to receive information, transmit information, or perform various other operations as described herein.

The communications manager 620 may support wireless communication at a first UE in accordance with examples as disclosed herein. The control message component 625 may be configured as or otherwise support a means for receiving, from a second UE, a control message that indicates a duration of time the second UE has reserved at least a first subchannel of a first subband of a set of shared spectrum subbands, the duration of time including a quantity of time periods. The power reservation signal component 630 may be configured as or otherwise support a means for transmitting, during a time period of the quantity of time periods and in a second subchannel of the first subband, a power reservation signal that indicates a transmission power associated with the first UE beginning transmission to a third UE in a second subband of the set of shared spectrum subbands and partway through the time period. The signaling component 635 may be configured as or otherwise support a means for transmitting signaling to the third UE in the second subband partway through the time period and after transmitting the power reservation signal.

Additionally or alternatively, the communications manager 620 may support wireless communication at a first UE in accordance with examples as disclosed herein. The control message component 625 may be configured as or otherwise support a means for receiving, from a second UE, a control message that indicates a duration of time the second UE has reserved at least a first subchannel of a subband of a set of shared spectrum bands, the duration of time including a quantity of time periods. The power reservation signal component 630 may be configured as or otherwise support a means for receiving, from a third UE in a second subchannel of the subband during a time period of the quantity of time periods, a power reservation signal that indicates a transmission power associated with the first UE beginning transmission in a second subband of the set of shared spectrum subbands partway through the time period. The signaling component 635 may be configured as or otherwise support a means for receiving, from the second UE during the time period, signaling in the first subchannel based on the power reservation signal.

Figure 7:
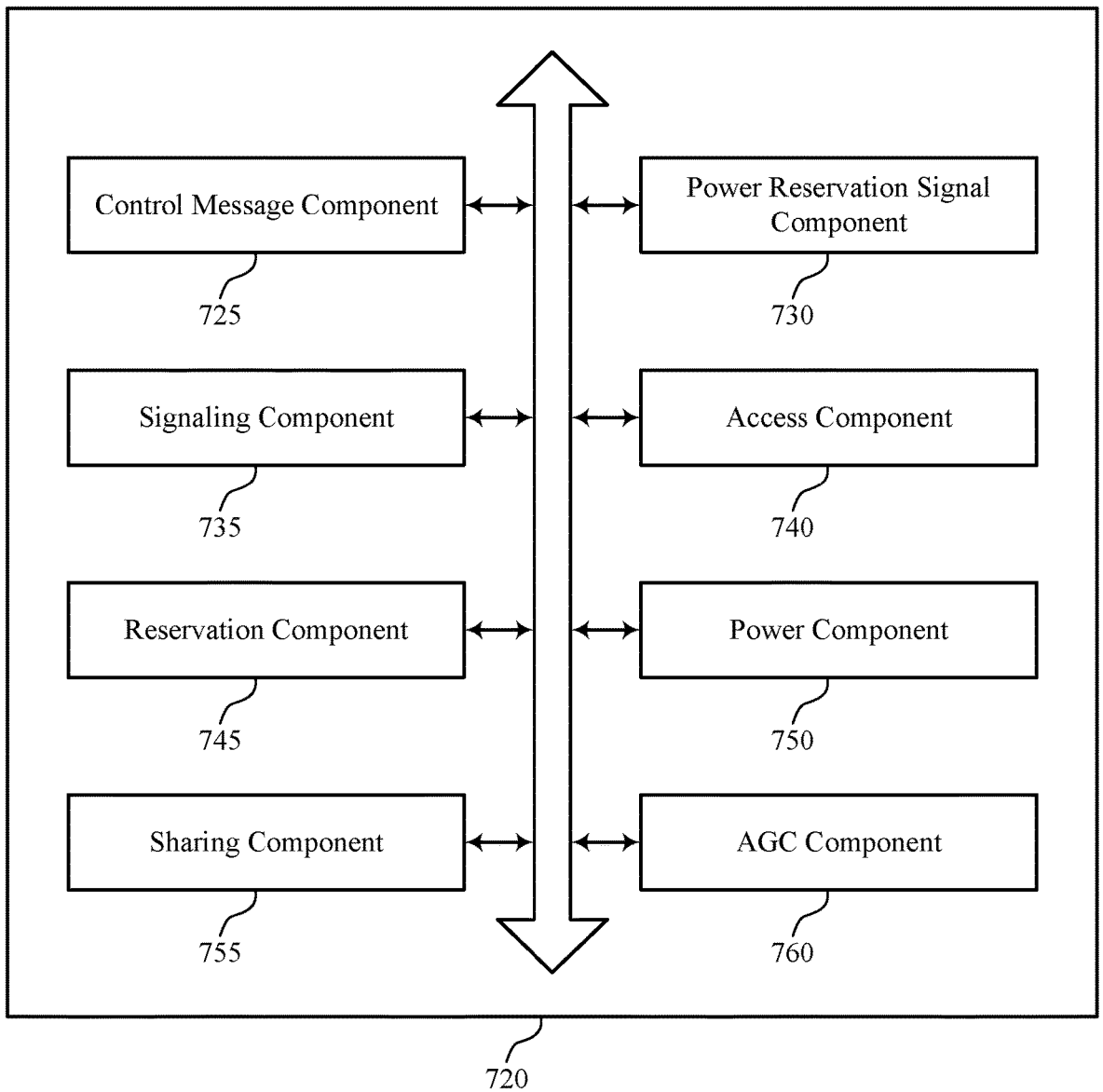
FIG. 7 shows a block diagram of a communications manager that supports a cross-subband power reservation signal in accordance with aspects of the present disclosure.

FIG. 7 shows a block diagram 700 of a communications manager 720 that supports a cross-subband power reservation signal in accordance with aspects of the present disclosure. The communications manager 720 may be an example of aspects of a communications manager 520, a communications manager 620, or both, as described herein. The communications manager 720, or various components thereof, may be an example of means for performing various aspects of cross-subband power reservation signal as described herein. For example, the communications manager 720 may include a control message component 725, a power reservation signal component 730, a signaling component 735, an access component 740, a reservation component 745, a power component 750, a sharing component 755, an AGC component 760, or any combination thereof. Each of these components may communicate, directly or indirectly, with one another (e.g., via one or more buses).

The communications manager 720 may support wireless communication at a first UE in accordance with examples as disclosed herein. The control message component 725 may be configured as or otherwise support a means for receiving, from a second UE, a control message that indicates a duration of time the second UE has reserved at least a first subchannel of a first subband of a set of shared spectrum subbands, the duration of time including a quantity of time periods. The power reservation signal component 730 may be configured as or otherwise support a means for transmitting, during a time period of the quantity of time periods and in a second subchannel of the first subband, a power reservation signal that indicates a transmission power associated with the first UE beginning transmission to a third UE in a second subband of the set of shared spectrum subbands and partway through the time period. The signaling component 735 may be configured as or otherwise support a means for transmitting signaling to the third UE in the second subband partway through the time period and after transmitting the power reservation signal.

In some examples, to support transmitting the power reservation signal, the power reservation signal component 730 may be configured as or otherwise support a means for transmitting the power reservation signal during a temporally first symbol of the slot. In some examples, the control message component 725 may be configured as or otherwise support a means for receiving a second control message indicating that the second subchannel and the temporally first symbol are reserved for the power reservation signal, where the power reservation signal is transmitted during the temporally first symbol in the second subchannel based on the second control message.

In some examples, to support transmitting the power reservation signal, the control message component 725 may be configured as or otherwise support a means for transmitting the power reservation signal with the comb index, the cyclic shift, or both, based on the second control message. In some examples, to support transmitting the power reservation signal, the power reservation signal component 730 may be configured as or otherwise support a means for transmitting the power reservation signal with a peak-to-average power ratio lower than a threshold, transmitting the power reservation signal as a comb-based reference signal, or both.

In some examples, the access component 740 may be configured as or otherwise support a means for performing a channel access procedure before the time period, where the power reservation signal is transmitted based on performing the channel access procedure.

In some examples, the control message indicates a set of UEs permitted to transmit during the quantity of time periods, and the sharing component 755 may be configured as or otherwise support a means for determining that the set of UEs excludes the first UE, where the channel access procedure is performed based on the determination.

In some examples, the reservation component 745 may be configured as or otherwise support a means for reserving a third subchannel of the second subband for at least a second time period. In some examples, the reservation component 745 may be configured as or otherwise support a means for transmitting, during the second time period in a fourth subchannel of the second subband, an automatic gain control training signal that indicates a transmission power associated with the first UE beginning transmission in the fourth subchannel of the second subband partway through the second time period.

In some examples, the reservation component 745 may be configured as or otherwise support a means for reserving a third subchannel of the second subband for at least a second time period. In some examples, the power reservation signal component 730 may be configured as or otherwise support a means for transmitting, during the second time period in a fourth subchannel of the second subband, a second power reservation symbol that indicates a transmission power associated with the first UE beginning transmission in the fourth subchannel of the second subband partway through the second time period.

In some examples, the access component 740 may be configured as or otherwise support a means for determining that the quantity of time periods includes the time period in which the UE begins transmission partway through the time period, where the power reservation signal is transmitted based on the determination. In some examples, the access component 740 may be configured as or otherwise support a means for performing a channel access procedure within the time period and after transmitting the power reservation signal, where the signaling is transmitted based on performing the channel access procedure.

Additionally or alternatively, the communications manager 720 may support wireless communication at a first UE in accordance with examples as disclosed herein. In some examples, the control message component 725 may be configured as or otherwise support a means for receiving, from a second UE, a control message that indicates a duration of time the second UE has reserved at least a first subchannel of a subband of a set of shared spectrum bands, the duration of time including a quantity of time periods. In some examples, the power reservation signal component 730 may be configured as or otherwise support a means for receiving, from a third UE in a second subchannel of the subband during a time period of the quantity of time periods, a power reservation signal that indicates a transmission power associated with the first UE beginning transmission in a second subband of the set of shared spectrum subbands partway through the time period. In some examples, the signaling component 735 may be configured as or otherwise support a means for receiving, from the second UE during the time period, signaling in the first subchannel based on the power reservation signal.

In some examples, to support receiving the signaling, the power component 750 may be configured as or otherwise support a means for determining a receive power for receiving the signaling based on the power reservation signal. In some examples, performing an automatic gain control procedure based on the power reservation signal, where the receive power is determined based on performing the automatic gain control procedure.

In some examples, to support receiving the power reservation signal, the power reservation signal component 730 may be configured as or otherwise support a means for receiving the power reservation signal during a temporally first symbol of the slot. In some examples, the control message component 725 may be configured as or otherwise support a means for receiving a second control message indicating that the second subchannel and the temporally first symbol are reserved for the power reservation signal, where the power reservation signal is received during the temporally first symbol in the second subchannel based on the second control message. In some examples, to support receiving the power reservation signal, the control message component 725 may be configured as or otherwise support a means for receiving the power reservation signal with the comb index, the cyclic shift, or both, based on the second control message.

Figure 8:
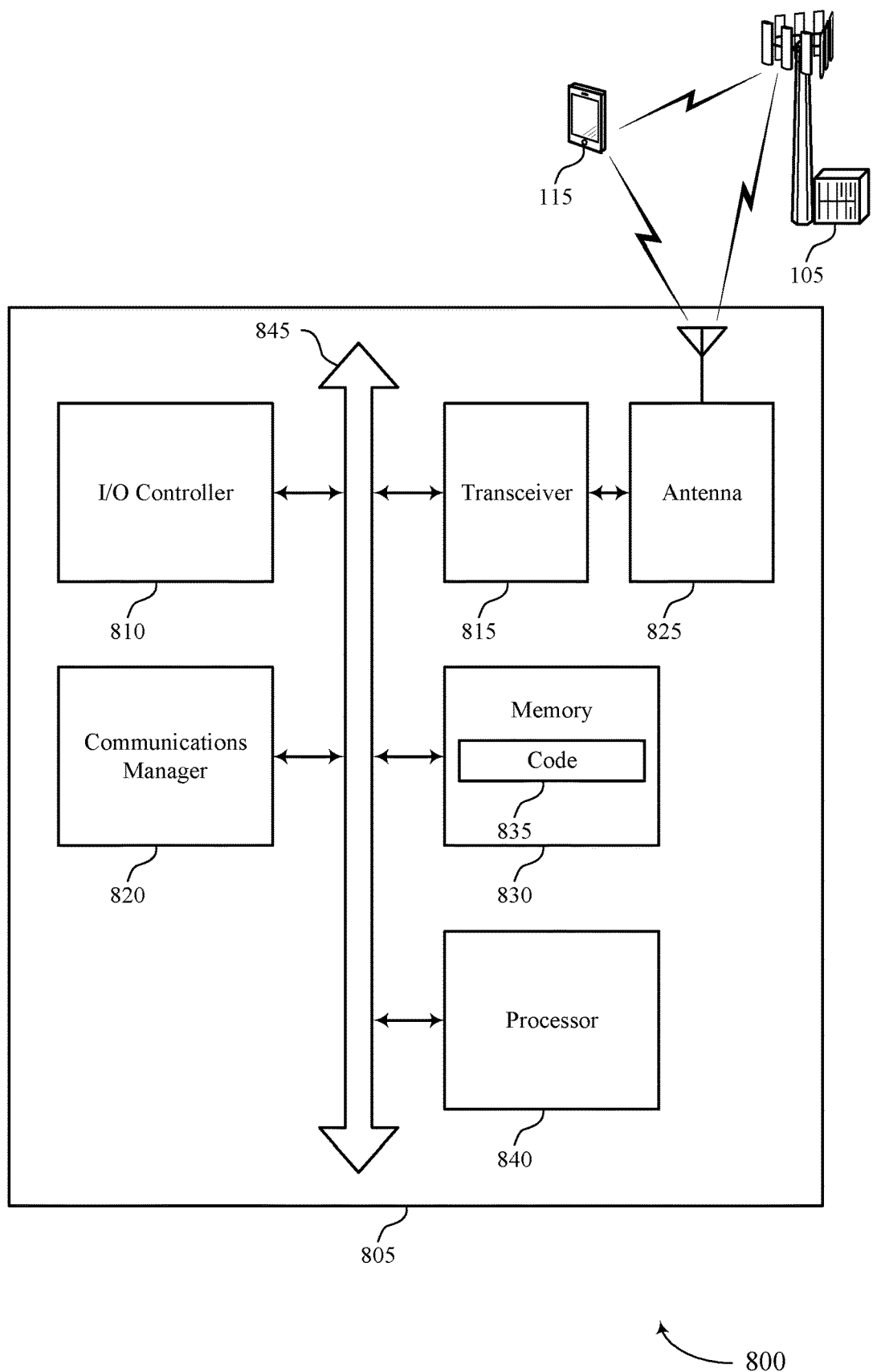
FIG. 8 shows a diagram of a system including a device that supports a cross-subband power reservation signal in accordance with aspects of the present disclosure.

FIG. 8 shows a diagram of a system 800 including a device 805 that supports a cross-subband power reservation signal in accordance with aspects of the present disclosure. The device 805 may be an example of or include the components of a device 505, a device 605, or a UE 115 as described herein. The device 805 may communicate wirelessly with one or more base stations 105, UEs 115, or any combination thereof. The device 805 may include components for bi-directional voice and data communications including components for transmitting and receiving communications, such as a communications manager 820, an input/output (I/O) controller 810, a transceiver 815, an antenna 825, a memory 830, code 835, and a processor 840. These components may be in electronic communication or otherwise coupled (e.g., operatively, communicatively, functionally, electronically, electrically) via one or more buses (e.g., a bus 845).

The I/O controller 810 may manage input and output signals for the device 805. The I/O controller 810 may also manage peripherals not integrated into the device 805. In some cases, the I/O controller 810 may represent a physical connection or port to an external peripheral. In some cases, the I/O controller 810 may utilize an operating system such as iOS®, ANDROID®, MS-DOS®, MS-WINDOWS®, OS/2®, UNIX®, LINUX®, or another known operating system. Additionally or alternatively, the I/O controller 810 may represent or interact with a modem, a keyboard, a mouse, a touchscreen, or a similar device. In some cases, the I/O controller 810 may be implemented as part of a processor, such as the processor 840. In some cases, a user may interact with the device 805 via the I/O controller 810 or via hardware components controlled by the I/O controller 810.

In some cases, the device 805 may include a single antenna 825. However, in some other cases, the device 805 may have more than one antenna 825, which may be capable of concurrently transmitting or receiving multiple wireless transmissions. The transceiver 815 may communicate bi-directionally, via the one or more antennas 825, wired, or wireless links as described herein. For example, the transceiver 815 may represent a wireless transceiver and may communicate bi-directionally with another wireless transceiver. The transceiver 815 may also include a modem to modulate the packets, to provide the modulated packets to one or more antennas 825 for transmission, and to demodulate packets received from the one or more antennas 825. The transceiver 815, or the transceiver 815 and one or more antennas 825, may be an example of a transmitter 515, a transmitter 615, a receiver 510, a receiver 610, or any combination thereof or component thereof, as described herein.

The memory 830 may include random access memory (RAM) and read-only memory (ROM). The memory 830 may store computer-readable, computer-executable code 835 including instructions that, when executed by the processor 840, cause the device 805 to perform various functions described herein. The code 835 may be stored in a non-transitory computer-readable medium such as system memory or another type of memory. In some cases, the code 835 may not be directly executable by the processor 840 but may cause a computer (e.g., when compiled and executed) to perform functions described herein. In some cases, the memory 830 may contain, among other things, a basic I/O system (BIOS) which may control basic hardware or software operation such as the interaction with peripheral components or devices.

The processor 840 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 840 may be configured to operate a memory array using a memory controller. In some other cases, a memory controller may be integrated into the processor 840. The processor 840 may be configured to execute computer-readable instructions stored in a memory (e.g., the memory 830) to cause the device 805 to perform various functions (e.g., functions or tasks supporting cross-subband power reservation signal). For example, the device 805 or a component of the device 805 may include a processor 840 and memory 830 coupled to the processor 840, the processor 840 and memory 830 configured to perform various functions described herein.

The communications manager 820 may support wireless communication at a first UE in accordance with examples as disclosed herein. For example, the communications manager 820 may be configured as or otherwise support a means for receiving, from a second UE, a control message that indicates a duration of time the second UE has reserved at least a first subchannel of a first subband of a set of shared spectrum subbands, the duration of time including a quantity of time periods. The communications manager 820 may be configured as or otherwise support a means for transmitting, during a time period of the quantity of time periods and in a second subchannel of the first subband, a power reservation signal that indicates a transmission power associated with the first UE beginning transmission to a third UE in a second subband of the set of shared spectrum subbands and partway through the time period. The communications manager 820 may be configured as or otherwise support a means for transmitting signaling to the third UE in the second subband partway through the time period and after transmitting the power reservation signal.

Additionally or alternatively, the communications manager 820 may support wireless communication at a first UE in accordance with examples as disclosed herein. For example, the communications manager 820 may be configured as or otherwise support a means for receiving, from a second UE, a control message that indicates a duration of time the second UE has reserved at least a first subchannel of a subband of a set of shared spectrum bands, the duration of time including a quantity of time periods. The communications manager 820 may be configured as or otherwise support a means for receiving, from a third UE in a second subchannel of the subband during a time period of the quantity of time periods, a power reservation signal that indicates a transmission power associated with the first UE beginning transmission in a second subband of the set of shared spectrum subbands partway through the time period. The communications manager 820 may be configured as or otherwise support a means for receiving, from the second UE during the time period, signaling in the first subchannel based on the power reservation signal.

By including or configuring the communications manager 820 in accordance with examples as described herein, the device 805 may support techniques for improved communication reliability.

In some examples, the communications manager 820 may be configured to perform various operations (e.g., receiving, monitoring, transmitting) using or otherwise in cooperation with the transceiver 815, the one or more antennas 825, or any combination thereof. Although the communications manager 820 is illustrated as a separate component, in some examples, one or more functions described with reference to the communications manager 820 may be supported by or performed by the processor 840, the memory 830, the code 835, or any combination thereof. For example, the code 835 may include instructions executable by the processor 840 to cause the device 805 to perform various aspects of cross-subband power reservation signal as described herein, or the processor 840 and the memory 830 may be otherwise configured to perform or support such operations.

Figure 9:
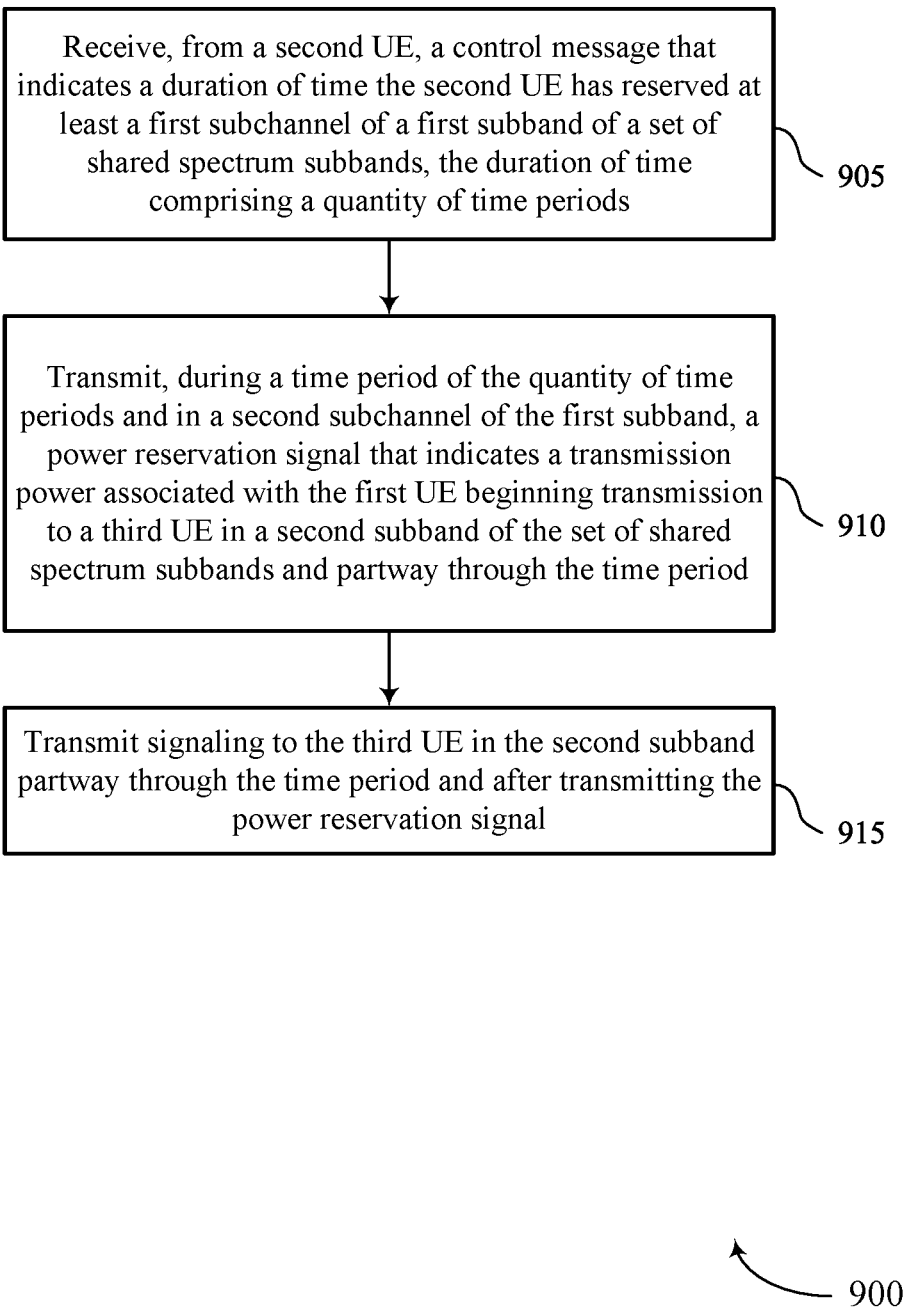
FIGS. 9 and 10 show flowcharts illustrating methods that support a cross-subband power reservation signal in accordance with aspects of the present disclosure.

FIG. 9 shows a flowchart illustrating a method 900 that supports a cross-subband power reservation signal in accordance with aspects of the present disclosure. The operations of the method 900 may be implemented by a UE or its components as described herein. For example, the operations of the method 900 may be performed by a UE 115 as described with reference to FIGS. 1 through 8. In some examples, a UE may execute a set of instructions to control the functional elements of the UE to perform the described functions. Additionally or alternatively, the UE may perform aspects of the described functions using special-purpose hardware.

At 905, the method may include receiving, from a second UE, a control message that indicates a duration of time the second UE has reserved at least a first subchannel of a first subband of a set of shared spectrum subbands, the duration of time including a quantity of time periods. The operations of 905 may be performed in accordance with examples as disclosed herein. In some examples, aspects of the operations of 905 may be performed by a control message component 725 as described with reference to FIG. 7.

At 910, the method may include transmitting, during a time period of the quantity of time periods and in a second subchannel of the first subband, a power reservation signal that indicates a transmission power associated with the first UE beginning transmission to a third UE in a second subband of the set of shared spectrum subbands and partway through the time period. The operations of 910 may be performed in accordance with examples as disclosed herein. In some examples, aspects of the operations of 910 may be performed by a power reservation signal component 730 as described with reference to FIG. 7.

At 915, the method may include transmitting signaling to the third UE in the second subband partway through the time period and after transmitting the power reservation signal. The operations of 915 may be performed in accordance with examples as disclosed herein. In some examples, aspects of the operations of 915 may be performed by a signaling component 735 as described with reference to FIG. 7.

Figure 10:
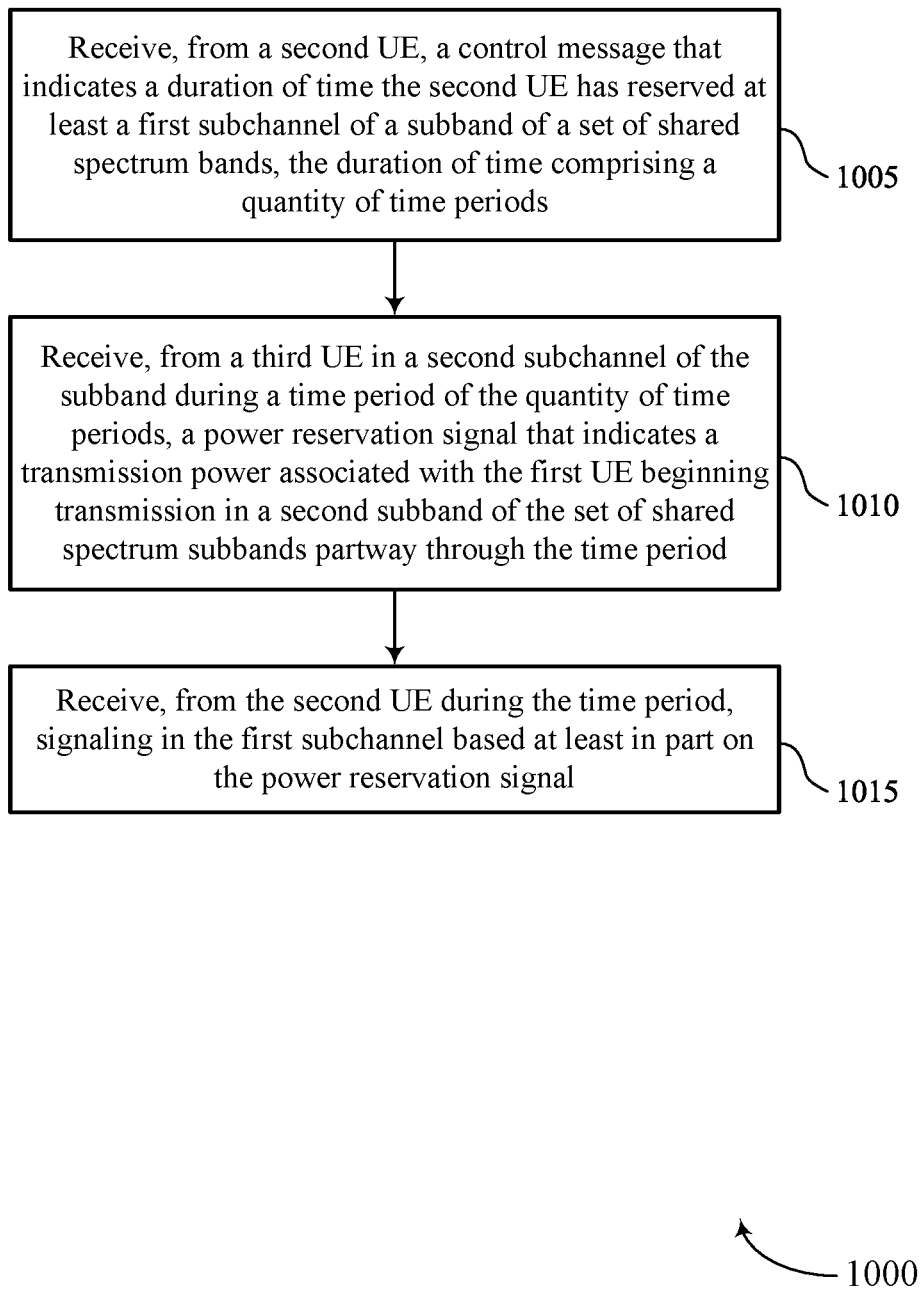

FIG. 10 shows a flowchart illustrating a method 1000 that supports a cross-subband power reservation signal in accordance with aspects of the present disclosure. The operations of the method 1000 may be implemented by a UE or its components as described herein. For example, the operations of the method 1000 may be performed by a UE 115 as described with reference to FIGS. 1 through 8. In some examples, a UE may execute a set of instructions to control the functional elements of the UE to perform the described functions. Additionally or alternatively, the UE may perform aspects of the described functions using special-purpose hardware.

At 1005, the method may include receiving, from a second UE, a control message that indicates a duration of time the second UE has reserved at least a first subchannel of a subband of a set of shared spectrum bands, the duration of time including a quantity of time periods. The operations of 1005 may be performed in accordance with examples as disclosed herein. In some examples, aspects of the operations of 1005 may be performed by a control message component 725 as described with reference to FIG. 7.

At 1010, the method may include receiving, from a third UE in a second subchannel of the subband during a time period of the quantity of time periods, a power reservation signal that indicates a transmission power associated with the first UE beginning transmission in a second subband of the set of shared spectrum subbands partway through the time period. The operations of 1010 may be performed in accordance with examples as disclosed herein. In some examples, aspects of the operations of 1010 may be performed by a power reservation signal component 730 as described with reference to FIG. 7.

At 1015, the method may include receiving, from the second UE during the time period, signaling in the first subchannel based on the power reservation signal. The operations of 1015 may be performed in accordance with examples as disclosed herein. In some examples, aspects of the operations of 1015 may be performed by a signaling component 735 as described with reference to FIG. 7.

The following provides an overview of aspects of the present disclosure:

Aspect 1: A method for wireless communication at a first UE, comprising: receiving, from a second UE, a control message that indicates a duration of time the second UE has reserved at least a first subchannel of a first subband of a set of shared spectrum subbands, the duration of time comprising a quantity of time periods; transmitting, during a time period of the quantity of time periods and in a second subchannel of the first subband, a power reservation signal that indicates a transmission power associated with the first UE beginning transmission to a third UE in a second subband of the set of shared spectrum subbands and partway through the time period; and transmitting signaling to the third UE in the second subband partway through the time period and after transmitting the power reservation signal.

Aspect 2: The method of aspect 1, wherein the time period comprises a slot, and wherein transmitting the power reservation signal comprises: transmitting the power reservation signal during a temporally first symbol of the slot.

Aspect 3: The method of aspect 2, further comprising: receiving a second control message indicating that the second subchannel and the temporally first symbol are reserved for the power reservation signal, wherein the power reservation signal is transmitted during the temporally first symbol in the second subchannel based at least in part on the second control message.

Aspect 4: The method of aspect 3, wherein the second control message indicates a comb index, a cyclic shift, or both for the power reservation signal, and wherein transmitting the power reservation signal comprises: transmitting the power reservation signal with the comb index, the cyclic shift, or both, based at least in part on the second control message.

Aspect 5: The method of any of aspects 1 through 4, wherein transmitting the power reservation signal comprises: transmitting the power reservation signal with a peak-to-average power ratio lower than a threshold, transmitting the power reservation signal as a comb-based reference signal, or both.

Aspect 6: The method of any of aspects 1 through 5, further comprising: performing a channel access procedure before the time period, wherein the power reservation signal is transmitted based at least in part on performing the channel access procedure.

Aspect 7: The method of aspect 6, wherein the control message indicates a set of UEs permitted to transmit during the quantity of time periods, the method further comprising: determining that the set of UEs excludes the first UE, wherein the channel access procedure is performed based at least in part on the determination.

Aspect 8: The method of any of aspects 1 through 7, further comprising: reserving a third subchannel of the second subband for at least a second time period; and transmitting, during the second time period in a fourth subchannel of the second subband, an automatic gain control training signal that indicates a transmission power associated with the first UE beginning transmission in the fourth subchannel of the second subband partway through the second time period.

Aspect 9: The method of any of aspects 1 through 7, further comprising: reserving a third subchannel of the second subband for at least a second time period; and transmitting, during the second time period in a fourth subchannel of the second subband, a second power reservation symbol that indicates a transmission power associated with the first UE beginning transmission in the fourth subchannel of the second subband partway through the second time period.

Aspect 10: The method of any of aspects 1 through 9, further comprising: determining that the quantity of time periods includes the time period in which the UE begins transmission partway through the time period, wherein the power reservation signal is transmitted based at least in part on the determination.

Aspect 11: The method of any of aspects 1 through 10, further comprising: performing a channel access procedure within the time period and after transmitting the power reservation signal, wherein the signaling is transmitted based at least in part on performing the channel access procedure.

Aspect 12: A method for wireless communication at a first UE, comprising: receiving, from a second UE, a control message that indicates a duration of time the second UE has reserved at least a first subchannel of a subband of a set of shared spectrum bands, the duration of time comprising a quantity of time periods; receiving, from a third UE in a second subchannel of the subband during a time period of the quantity of time periods, a power reservation signal that indicates a transmission power associated with the first UE beginning transmission in a second subband of the set of shared spectrum subbands partway through the time period; and receiving, from the second UE during the time period, signaling in the first subchannel based at least in part on the power reservation signal.

Aspect 13: The method of aspect 12, wherein receiving the signaling comprises: determining a receive power for receiving the signaling based at least in part on the power reservation signal.

Aspect 14: The method of aspect 13, further comprises performing an automatic gain control procedure based at least in part on the power reservation signal, wherein the receive power is determined based at least in part on performing the automatic gain control procedure.

Aspect 15: The method of any of aspects 12 through 14, wherein the time period comprises a slot, and wherein receiving the power reservation signal comprises: receiving the power reservation signal during a temporally first symbol of the slot.

Aspect 16: The method of aspect 15, further comprising: receiving a second control message indicating that the second subchannel and the temporally first symbol are reserved for the power reservation signal, wherein the power reservation signal is received during the temporally first symbol in the second subchannel based at least in part on the second control message.

Aspect 17: The method of aspect 16, wherein the second control message indicates a comb index, a cyclic shift, or both for the power reservation signal, and wherein receiving the power reservation signal comprises: receiving the power reservation signal with the comb index, the cyclic shift, or both, based at least in part on the second control message.

Aspect 18: An apparatus for wireless communication at a first UE, comprising a processor; memory coupled with the processor; and instructions stored in the memory and executable by the processor to cause the apparatus to perform a method of any of aspects 1 through 11.

Aspect 19: An apparatus for wireless communication at a first UE, comprising at least one means for performing a method of any of aspects 1 through 11.

Aspect 20: A non-transitory computer-readable medium storing code for wireless communication at a first UE, the code comprising instructions executable by a processor to perform a method of any of aspects 1 through 11.

Aspect 21: An apparatus for wireless communication at a first UE, comprising a processor; memory coupled with the processor; and instructions stored in the memory and executable by the processor to cause the apparatus to perform a method of any of aspects 12 through 17.

Aspect 22: An apparatus for wireless communication at a first UE, comprising at least one means for performing a method of any of aspects 12 through 17.

Aspect 23: A non-transitory computer-readable medium storing code for wireless communication at a first UE, the code comprising instructions executable by a processor to perform a method of any of aspects 12 through 17.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

The term "determine" or "determining" encompasses a wide variety of actions and, therefore, "determining" can include calculating, computing, processing, deriving, investigating, looking up (such as via looking up in a table, a database or another data structure), ascertaining and the like. Also, "determining" can include receiving (such as receiving information), accessing (such as accessing data in a memory) and the like. Also, "determining" can include resolving, selecting, choosing, establishing and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method for wireless communication at a first user equipment (UE), comprising:
receiving, from a second UE, a control message that indicates a duration of time the second UE has reserved at least a first subchannel of a first subband of a set of shared spectrum subbands, the duration of time comprising a quantity of time periods;
receiving a second control message indicating that a second subchannel and a temporally first symbol of a time period of the duration of time are reserved for a power reservation signal;
transmitting, during the temporally first symbol of the time period and in the second subchannel of the first subband, the power reservation signal that indicates a transmission power associated with the first UE beginning transmission to a third UE in a second subband of the set of shared spectrum subbands and partway through the time period, wherein the power reservation signal is for signaling to be transmitted from the first UE to the third UE, the second subband being different than the first subband, and wherein the power reservation signal is transmitted during the temporally first symbol in the second subchannel based at least in part on the second control message; and
transmitting the signaling to the third UE in the second subband partway through the time period of the duration of time reserved by the second UE and after transmitting the power reservation signal.

2. The method of claim 1, wherein the second control message indicates a comb index, a cyclic shift, or both for the power reservation signal, and wherein transmitting the power reservation signal comprises:
transmitting the power reservation signal with the comb index, the cyclic shift, or both, based at least in part on the second control message.

3. The method of claim 1, wherein transmitting the power reservation signal comprises:
transmitting the power reservation signal with a peak-to-average power ratio lower than a threshold, transmitting the power reservation signal as a comb-based reference signal, or both.

4. The method of claim 1, further comprising:
performing a channel access procedure before the time period, wherein the power reservation signal is transmitted based at least in part on performing the channel access procedure.

5. The method of claim 4, wherein the control message indicates a set of UEs permitted to transmit during the quantity of time periods, the method further comprising:
determining that the set of UEs excludes the first UE, wherein the channel access procedure is performed based at least in part on the determination.

6. The method of claim 1, further comprising:
reserving a third subchannel of the second subband for at least a second time period; and
transmitting, during the second time period in a fourth subchannel of the second subband, an automatic gain control training signal that indicates a transmission power associated with the first UE beginning transmission in the fourth subchannel of the second subband partway through the second time period.

7. The method of claim 1, further comprising:
reserving a third subchannel of the second subband for at least a second time period; and
transmitting, during the second time period in a fourth subchannel of the second subband, a second power reservation symbol that indicates a transmission power associated with the first UE beginning transmission in the fourth subchannel of the second subband partway through the second time period.

8. The method of claim 1, further comprising:
determining that the quantity of time periods includes the time period in which the first UE begins transmission partway through the time period, wherein the power reservation signal is transmitted based at least in part on the determination.

9. The method of claim 1, further comprising:
performing a channel access procedure within the time period and after transmitting the power reservation signal, wherein the signaling is transmitted based at least in part on performing the channel access procedure.

10. A method for wireless communication at a first user equipment (UE), comprising:
receiving, from a second UE, a control message that indicates a duration of time the second UE has reserved at least a first subchannel of a first subband of a set of shared spectrum subbands, the duration of time comprising a quantity of time periods;
receiving a second control message indicating that a second subchannel and a temporally first symbol of a time period of the duration of time are reserved for a power reservation signal;
receiving, from a third UE in the second subchannel of the first subband during the temporally first symbol of the time period, the power reservation signal that indicates a transmission power associated with the first UE beginning transmission in a second subband of the set of shared spectrum subbands partway through the time period, wherein the power reservation signal is for signaling to be transmitted from the first UE the third UE, the second subband being different than the first subband, and wherein the power reservation signal is received during the temporally first symbol in the second subchannel based at least in part on the second control message; and
receiving, from the second UE during the time period reserved by the second UE, signaling in the first subchannel based at least in part on the power reservation signal.

11. The method of claim 10, wherein receiving the signaling comprises:
determining a receive power for receiving the signaling based at least in part on the power reservation signal.

12. The method of claim 11, further comprising:
performing an automatic gain control procedure based at least in part on the power reservation signal, wherein the receive power is determined based at least in part on performing the automatic gain control procedure.

13. The method of claim 10, wherein the second control message indicates a comb index, a cyclic shift, or both for the power reservation signal, and wherein receiving the power reservation signal comprises:
receiving the power reservation signal with the comb index, the cyclic shift, or both, based at least in part on the second control message.

14. An apparatus for wireless communication at a first user equipment (UE), comprising:
a processor;
memory coupled with the processor; and
instructions stored in the memory and executable by the processor to cause the apparatus to:
receive, from a second UE, a control message that indicates a duration of time the second UE has reserved at least a first subchannel of a first subband of a set of shared spectrum subbands, the duration of time comprising a quantity of time periods;
receive a second control message indicating that a second subchannel and a temporally first symbol of a time period of the duration of time are reserved for a power reservation signal;
transmit, during the temporally first symbol of the time period and in the second subchannel of the first subband, the power reservation signal that indicates a transmission power associated with the first UE beginning transmission to a third UE in a second subband of the set of shared spectrum subbands and partway through the time period, wherein the power reservation signal is for signaling to be transmitted from the first UE beginning a transmission to the third UE, the second subband being different than the first subband, and wherein the power reservation signal is transmitted during the temporally first symbol in the second subchannel based at least in part on the second control message; and
transmit the signaling to the third UE in the second subband partway through the time period of the duration of time reserved by the second UE and after transmitting the power reservation signal.

15. The apparatus of claim 14, wherein the second control message indicates a comb index, a cyclic shift, or both for the power reservation signal, and wherein the instructions to transmit the power reservation signal are executable by the processor to cause the apparatus to:
transmit the power reservation signal with the comb index, the cyclic shift, or both, based at least in part on the second control message.

16. The apparatus of claim 14, wherein the instructions to transmit the power reservation signal are executable by the processor to cause the apparatus to:
transmit the power reservation signal with a peak-to-average power ratio lower than a threshold, transmitting the power reservation signal as a comb-based reference signal, or both.

17. The apparatus of claim 14, wherein the instructions are further executable by the processor to cause the apparatus to:
perform a channel access procedure before the time period, wherein the power reservation signal is transmitted based at least in part on performing the channel access procedure.

18. The apparatus of claim 17, wherein the control message indicates a set of UEs permitted to transmit during the quantity of time periods, and the instructions are further executable by the processor to cause the apparatus to:
determine that the set of UEs excludes the first UE, wherein the channel access procedure is performed based at least in part on the determination.

19. The apparatus of claim 14, wherein the instructions are further executable by the processor to cause the apparatus to:
reserve a third subchannel of the second subband for at least a second time period; and
transmit, during the second time period in a fourth subchannel of the second subband, an automatic gain control training signal that indicates a transmission power associated with the first UE beginning transmission in the fourth subchannel of the second subband partway through the second time period.

20. The apparatus of claim 14, wherein the instructions are further executable by the processor to cause the apparatus to:
reserve a third subchannel of the second subband for at least a second time period; and
transmit, during the second time period in a fourth subchannel of the second subband, a second power reservation symbol that indicates a transmission power associated with the first UE beginning transmission in the fourth subchannel of the second subband partway through the second time period.

21. The apparatus of claim 14, wherein the instructions are further executable by the processor to cause the apparatus to:
determine that the quantity of time periods includes the time period in which the first UE begins transmission partway through the time period, wherein the power reservation signal is transmitted based at least in part on the determination.

22. The apparatus of claim 14, wherein the instructions are further executable by the processor to cause the apparatus to:
perform a channel access procedure within the time period and after transmitting the power reservation signal, wherein the signaling is transmitted based at least in part on performing the channel access procedure.

23. An apparatus for wireless communication at a first user equipment (UE), comprising:
a processor;
memory coupled with the processor; and
instructions stored in the memory and executable by the processor to cause the apparatus to:
receive, from a second UE, a control message that indicates a duration of time the second UE has reserved at least a first subchannel of a first subband of a set of shared spectrum bands, the duration of time comprising a quantity of time periods;
receive a second control message indicating that a second subchannel and a temporally first symbol of a time period of the duration of time are reserved for a power reservation signal;
receive, from a third UE in the second subchannel of the first subband during the temporally first symbol of the time period, the power reservation signal that indicates a transmission power associated with the first UE beginning transmission in a second subband of the set of shared spectrum subbands partway through the time period, wherein the power reservation signal is for signaling to be transmitted from the first UE to the third UE, the second subband being different than the first subband, and wherein the power reservation signal is received during the temporally first symbol in the second subchannel based at least in part on the second control message; and
receive, from the second UE during the time period reserved by the second UE, signaling in the first subchannel based at least in part on the power reservation signal.

24. The apparatus of claim 23, wherein the instructions to receive the signaling are executable by the processor to cause the apparatus to:

determine a receive power for receiving the signaling based at least in part on the power reservation signal.

\* \* \* \* \*